(12) United States Patent
Kawai et al.

(10) Patent No.: US 12,243,879 B2
(45) Date of Patent: Mar. 4, 2025

(54) DISPLAY DEVICE COMPRISING A PERIPHERAL CIRCUIT HAVING A TRANSISTOR AND A BLACK MATRIX INCLUDING AN OPENING IN A PERIPHERAL AREA

(71) Applicant: Japan Display Inc., Tokyo (JP)

(72) Inventors: Kentaro Kawai, Tokyo (JP); Yuuji Oomori, Tokyo (JP); Yoshihide Ohue, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/628,094

(22) Filed: Apr. 5, 2024

(65) Prior Publication Data

US 2024/0250094 A1 Jul. 25, 2024

Related U.S. Application Data

(63) Continuation of application No. 18/314,143, filed on May 9, 2023, now Pat. No. 11,984,454.

(30) Foreign Application Priority Data

May 12, 2022 (JP) .................................. 2022-079104

(51) Int. Cl.
| | |
|---|---|
| *H01L 27/12* | (2006.01) |
| *G02F 1/1333* | (2006.01) |
| *G02F 1/1334* | (2006.01) |
| *G02F 1/1335* | (2006.01) |
| *G02F 1/1362* | (2006.01) |

(52) U.S. Cl.
CPC ...... *H01L 27/124* (2013.01); *G02F 1/133357* (2021.01); *G02F 1/133388* (2021.01); *G02F 1/13347* (2021.01); *G02F 1/133512* (2013.01); *G02F 1/136286* (2013.01); *G02F 2202/16* (2013.01)

(58) Field of Classification Search
CPC .......................... G02F 1/13347; G02F 2202/16
See application file for complete search history.

(56) References Cited

U.S. PATENT DOCUMENTS

| | | | |
|---|---|---|---|
| 2005/0270433 A1* | 12/2005 | Ohue | .................... G02F 1/1362 349/113 |
| 2014/0036210 A1* | 2/2014 | Nakamura | ........ G02F 1/133345 349/123 |
| 2014/0049453 A1 | 2/2014 | Lee et al. | |
| 2017/0038637 A1* | 2/2017 | Takeda | .............. G02F 1/133512 |
| 2017/0261796 A1* | 9/2017 | Tamaki | ............. G02F 1/133512 |
| 2019/0302496 A1* | 10/2019 | Okuyama | ............ G09G 3/3406 |

* cited by examiner

*Primary Examiner* — Paul C Lee
(74) *Attorney, Agent, or Firm* — XSENSUS LLP

(57) ABSTRACT

The display device has a first substrate having a display area including pixels and a peripheral area surrounding the display area and including a peripheral circuit, a second substrate arranged facing the first substrate, a liquid crystal layer arranged between the first substrate and the second substrate, and a plurality of gate wirings spaced apart in a first direction in the peripheral circuit of the first substrate, and a plurality of signal lines spaced apart in a second direction intersecting the first direction, wherein the second substrate has a black matrix with a lattice area at a position facing the display area and the peripheral circuit, and the lattice area of the black matrix is arranged to overlap the plurality of gate wirings and the plurality of signal lines of the peripheral circuit.

10 Claims, 17 Drawing Sheets

DISPLAY DEVICE COMPRISING A PERIPHERAL CIRCUIT HAVING A TRANSISTOR AND A BLACK MATRIX INCLUDING AN OPENING IN A PERIPHERAL AREA

CROSS-REFERENCE TO RELATED APPLICATIONS

This application is a continuation of U.S. application Ser. No. 18/314,143, filed on May 9, 2023, which claims the benefit of priority to Japanese Patent Application No. 2022-079104, filed on May 12, 2022, the entire contents of each are incorporated herein by reference.

FIELD

An embodiment of the present invention relates to a display device.

BACKGROUND

In recent years, a transparent display that is capable of visually recognizing a background of one surface from the other surface on the opposite side has been developed (see Japanese laid-open patent publication No. 2020-160254). In the transparent display, various inspection circuits and various wirings are arranged between a display area and a gate wiring area arranged on an array substrate side. A black matrix arranged on the opposing substrate side is formed only in the display area (see Japanese laid-open patent publication No. 2021-92702).

SUMMARY

A display device according to an embodiment of the present invention includes a first substrate having a display area including pixels and a peripheral area surrounding the display area and including a peripheral circuit, a second substrate arranged facing the first substrate, a liquid crystal layer arranged between the first substrate and the second substrate, and a plurality of gate wirings spaced apart in a first direction in the peripheral circuit of the first substrate, and a plurality of signal lines spaced apart in a second direction intersecting the first direction, wherein the second substrate has a black matrix with a lattice area at a position facing the display area and the peripheral circuit, and the lattice area of the black matrix is arranged to overlap the plurality of gate wirings and the plurality of signal lines of the peripheral circuit.

DESCRIPTION OF EMBODIMENTS

Figure 1:
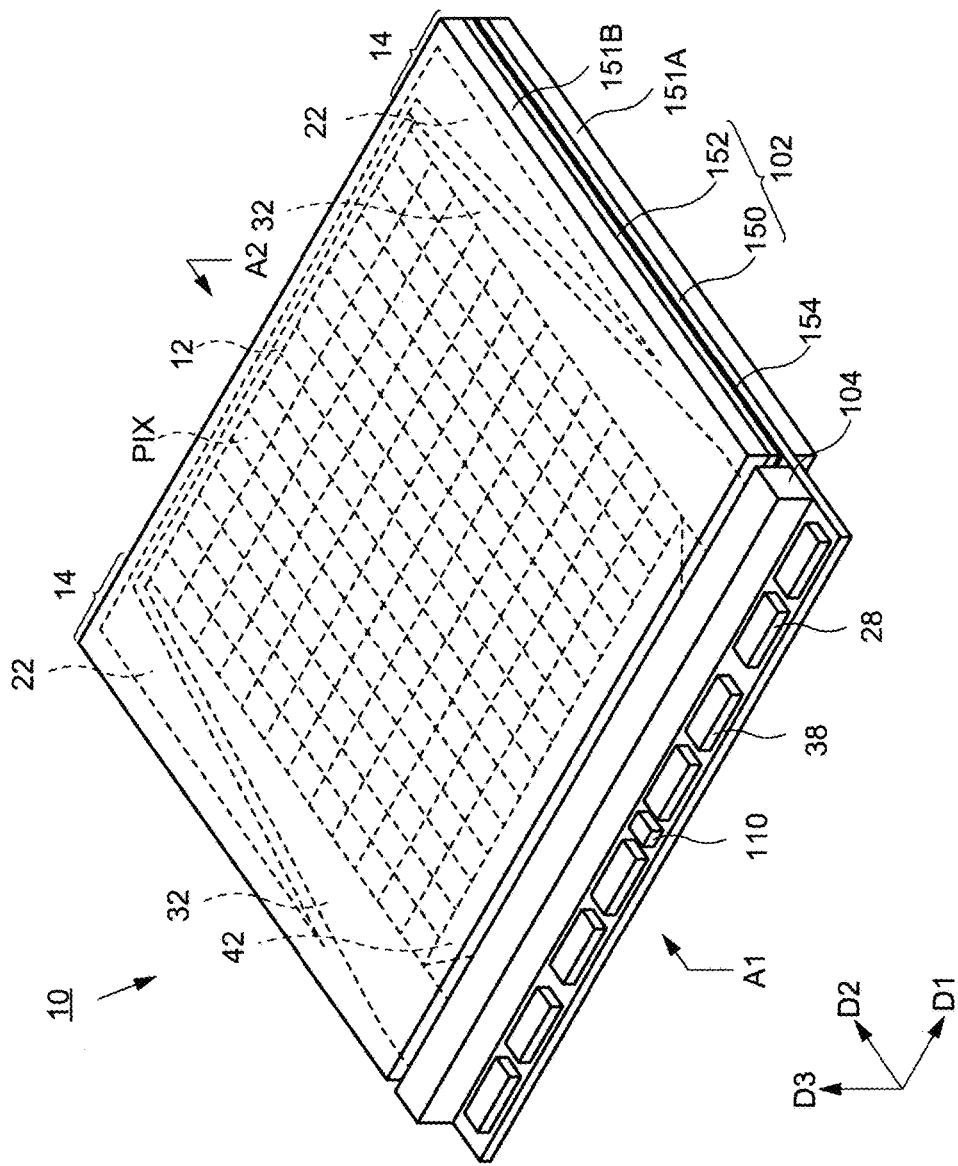
FIG. 1 is a perspective view for explaining an overview of a display device according to an embodiment of the present invention.

Hereinafter, embodiments of the present invention will be described with reference to the drawings and the like. However, the present invention can be mounted in various aspects without departing from the gist thereof, and is not to be construed as being limited to the description of the embodiments exemplified below. Further, with respect to the drawings, although the width, the thickness, the shape, and the like of each part may be schematically represented in comparison with the actual embodiment in order to clarify the description, the schematic drawings are merely examples, and do not limit the interpretation of the present invention. Further, in the present specification and the drawings, the same or similar elements as those described with respect to the drawings described above are denoted by the same symbols, and redundant description may be omitted. In this specification and the like, ordinal numbers are given for convenience in order to distinguish components, parts, and the like, and do not indicate priority or order.

In the present invention, in the case where a single film is processed to form a plurality of films, the plurality of films may have different functions and roles. However, the plurality of films is derived from films formed as the same layer in the same process, and has the same layer structure and the same material. Therefore, the plurality of films is defined as being present in the same layer. In addition, in the case where a plurality of films is formed by processing a certain film, in the present specification and the like, the films may be described separately as −1, −2, and the like.

In addition, in this specification and the like, expressions such as "upper" and "lower" represent relative positional relationships between a structure of interest and other structures. In the present specification and the like, in a side view, a direction from a first substrate to a pixel electrode, which will be described later, is defined as "upper", and a reverse direction thereof is defined as "lower". In this specification and claims, the expression "on" in describing the manner of arranging another structure on a certain structure shall include both arranging another structure directly above a certain structure and arranging another structure over a certain structure via yet another structure, unless otherwise specified.

In addition, in the present specification and the like, bottom-gate driving is such that on/off of a transistor is controlled by a gate electrode arranged below a semiconductor layer. In addition, in the present specification and the like, top-gate driving is such that on/off of a transistor is controlled by a gate electrode arranged above a semiconductor layer. In addition, in the present specification, dual-gate driving is such that on/off of a transistor is controlled by inputting the same control signal to a gate electrode arranged above and below a semiconductor layer.

First Embodiment

A display device 10 according to an embodiment of the present invention will be described with reference to FIG. 1 to FIG. 17.

Overview of Display Device

FIG. 1 is a perspective view of the display device 10 according to an embodiment of the present invention. The display device 10 includes a display panel 102 including an array substrate 150, an opposing substrate 152, a liquid crystal layer between the array substrate 150 and the opposing substrate 152 (not shown), a gate driving circuit 28, and a source driving circuit 38, a light source 104, and a first transparent substrate 151A and a second transparent substrate 151B sandwiching the display panel 102. In the following explanation referring to FIG. 1, one direction of the plane of the display panel 102 is a direction D1, a direction orthogonal to the direction D1 is a direction D2, and a direction orthogonal to the D1-D2 plane is a direction D3.

The array substrate 150 and the opposing substrate 152 have light-transmitting properties. The array substrate 150 and the opposing substrate 152 are preferably transparent to visible light. The opposing substrate 152 is arranged facing the array substrate 150 in the direction D3. The array substrate 150 and the opposing substrate 152 are bonded to each other by a sealing material 154 in a state of being arranged facing each other with a gap therebetween. The liquid crystal layer (not shown) is arranged in a gap between the array substrate 150 and the opposing substrate 152.

The display panel 102 has a display area 12 and a peripheral area 14 outside the display area 12. In the display area 12, a plurality of pixels PIX is arranged in a row direction and a column direction. Here, the row direction refers to a direction parallel to the direction D1, and the column direction refers to a direction parallel to the direction D2. In the display area 12, m pixels are arranged in the row direction, and n pixels are arranged in the column direction. The values of m and n are appropriately set according to a display resolution in the vertical direction and a display resolution in the horizontal direction. In the display area 12, a gate wiring (also referred to as a scan signal line) is arranged in the direction D1, and a source wiring (also referred to as a data signal line) is arranged in the direction D2.

The gate driving circuit 28 and the source driving circuit 38 are arranged in the peripheral area 14 of the array substrate 150. FIG. 1 shows an embodiment in which the gate driving circuit 28 and the source driving circuit 38 are arranged in an integrated circuit (IC) and are mounted in a COG (Chip on Glass) method to the array substrate 150. The gate driving circuit 28 and the source driving circuit 38 are not limited to the embodiments shown in the drawings, and may be mounted by a COF (Chip on Film) method or may be formed by a thin film transistor (TFT) of the array substrate 150.

A gate wiring area 32, a common wiring area 22, and a source wiring area 42 are arranged in the peripheral area 14. The gate wiring area 32 is an area in which a pattern formed by a wiring connecting the gate driving circuit 28 and a gate wiring GL arranged in the display area 12 is arranged. The common wiring area 22 is an area in which a pattern formed by a common wiring is arranged. The common wiring area 22 is used as a wiring for applying a common voltage to a common electrode 218 (see FIG. 5) arranged circuit-wise on the opposing substrate 152. The source wiring area 42 is an area in which a pattern formed by a wiring connecting the source driving circuit 38 and a source wiring SL arranged in the display area 12 is arranged.

The light source 104 has a structure along the direction D1. For example, the light source 104 includes a light emitting diode (LED) arranged along the direction D1. A detailed configuration of the light source 104 is not limited, and may include optical members such as a reflector, a diffuser, and a lens in addition to the light emitting diodes arranged in the direction D1. The light source 104 and a light emission control circuit 110 for controlling the light source 104 may be arranged as separate members independent of the display panel 102, and the light source 104 may be controlled in light emission timing by the light emission control circuit 110 synchronized with the gate driving circuit 28 and the source driving circuit 38. The light emission control circuit 110 for controlling the light source 104 may be arranged as a separate member as well as the light source 104 separately from the display panel 102, may be mounted on the array substrate 150 as an individual component, or may be incorporated in the gate driving circuit 28 or the source driving circuit 38.

The first transparent substrate 151A and the second transparent substrate 151B are arranged so as to sandwich the display area 12 and the peripheral area 14. The first transparent substrate 151A and the second transparent substrate 151B function as protective members of the display panel 102. Further, as described with reference to FIG. 2, the first transparent substrate 151A and the second transparent substrate 151B function as light guide plates for introducing the light emitted from the light source 104 into the display panel 102.

Figure 2:
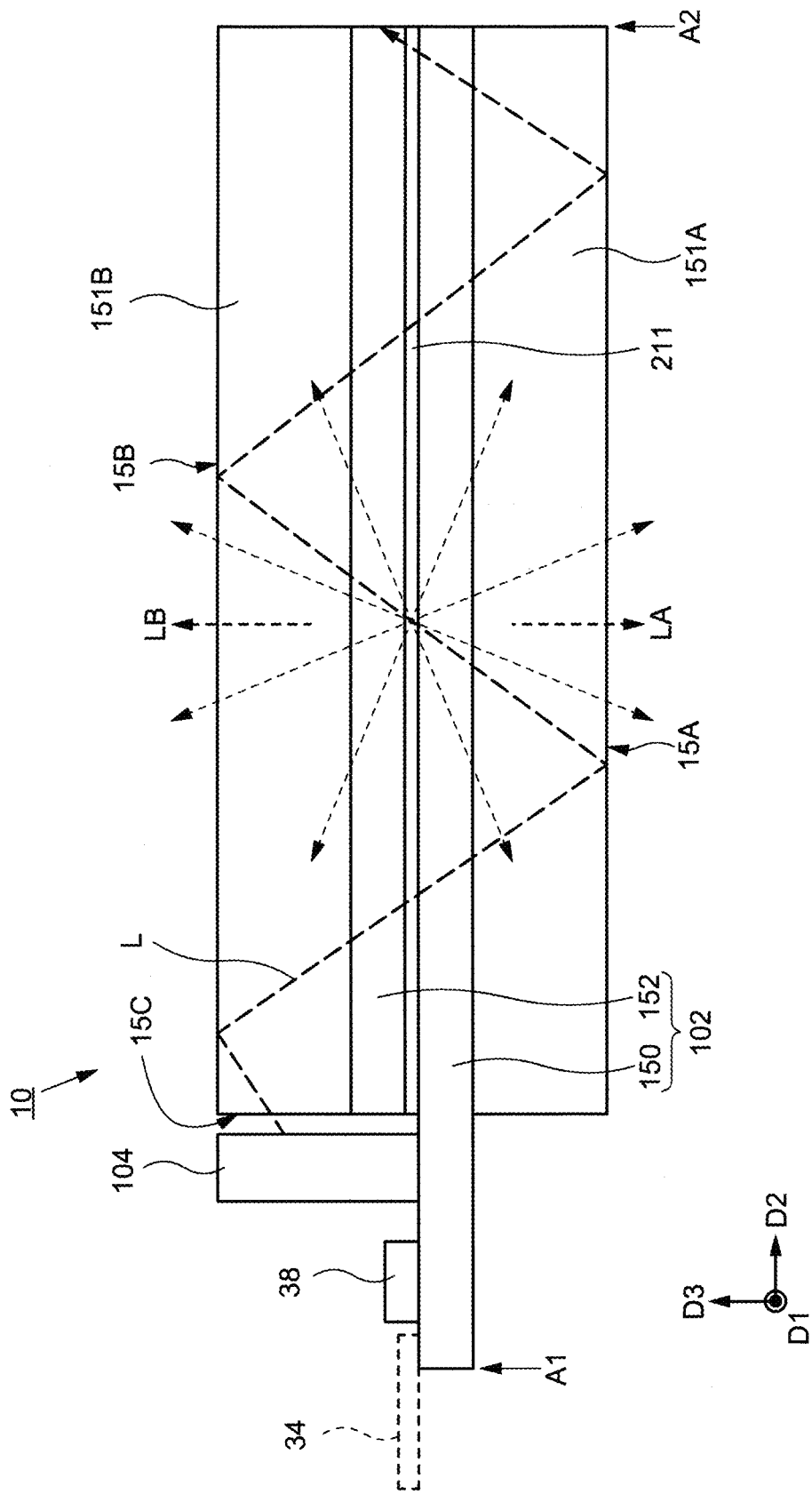
FIG. 2 is a schematic cross-sectional view showing a configuration corresponding to A1-A2 of the displaying device shown in FIG. 1.

FIG. 2 shows a cross-sectional configuration of the displaying device 10 corresponding to A1-A2 shown in FIG. 1. As shown in FIG. 2, the first transparent substrate 151A is arranged on a side of the array substrate 150 of the display panel 102, and the second transparent substrate 151B is arranged on a side of the opposing substrate 152. A glass substrate or a plastic substrate is used as the first transparent substrate 151A and the second transparent substrate 151B. The first transparent substrate 151A and the second transparent substrate 151B preferably have refractive indexes equivalent to those of the array substrate 150 and the opposing substrate 152. The array substrate 150 and the first transparent substrate 151A, and the opposing substrate 152 and the second transparent substrate 151B are bonded to each other with a transparent adhesive (not shown).

In the display panel 102, the array substrate 150 and the opposing substrate 152 are arranged facing each other, and a liquid crystal layer 211 is arranged therebetween. The array substrate 150 is larger than the opposing substrate 152, and has a size such that part of the peripheral area 14 is exposed from the opposing substrate 152. A driving circuit (source driving circuit 38 in FIG. 2) is mounted on the array substrate 150. A flexible printed circuit 34 is attached to a peripheral portion of the array substrate 150.

The light source 104 is arranged to be adjacent to one side surface of the first transparent substrate 151A or the second transparent substrate 151B. FIG. 2 shows a configuration in which the light source 104 is arranged along one side surface of the second transparent substrate 151B. Further, although FIG. 2 shows a configuration in which the light source 104 is attached to the array substrate 150, the configuration is not limited to the configuration in which the light source 104 is arranged, and the mounting structure is not limited as long as a mounting position can be fixed. For example, the light source 104 may be supported by a housing surrounding the display panel 102.

As shown in FIG. 2, the light source 104 is arranged along a first side surface 15C of the second transparent substrate 151B. As shown in FIG. 2, the light source 104 irradiates the first side surface 15C of the second transparent substrate 151B with a light L. The light source 104 may be referred to as a side light source because it emits the light L toward the first side surface 15C. The first side surface 15C of the second transparent substrate 151B facing the light source 104 serves as a light incidence surface.

As schematically shown in FIG. 2, the light L incident from the first side surface 15C of the second transparent substrate 151B propagates in a direction away from the first side surface 15C (the direction D2) while being reflected by a second plane 15B of the second transparent substrate 151B and a first plane 15A of the first transparent substrate 151A. When the light L is directed to the outside from the first plane 15A of the first transparent substrate 151A and the second plane 15B of the second transparent substrate 151B, the light L proceeds from a medium having a large refractive index to a medium having a small refractive index. In this case, if an incident angle of the light L incident on the first plane 15A and the second plane 15B is larger than a critical angle, the light L is totally reflected, and is guided to the direction D2 while being reflected by the first plane 15A and the second plane 15B.

The liquid crystal layer 211 is formed of a polymer-dispersed liquid crystal. In the liquid crystal layer 211 formed of the polymer-dispersed liquid crystal, a scattering state and a non-scattering state are controlled for each pixel PIX (see FIG. 1). As shown in FIG. 2, in the light L propagating while being reflected by the first plane 15A and the second plane 15B, if there is a pixel in which the liquid crystal layer 211 is in the scattering state, at least a part of the light is scattered, an incident angle of the scattered light becomes an angle smaller than the critical angle, scattered lights LA and LB are respectively emitted to the outside from the first plane 15A and the second plane 15B, and the emitted scattered lights LA and LB are observed by an observer. In the display panel 102, an area other than an area where the scattered lights LA and LB are emitted is substantially transparent because the array substrate 150, the opposing substrate 152, the first transparent substrate 151A, and the second transparent substrate 151B are translucent (transparent to visible light), and the liquid crystal layer 211 is in the non-scattering state, and the observer can visually recognize the back side through the display panel 102.

Figure 3:
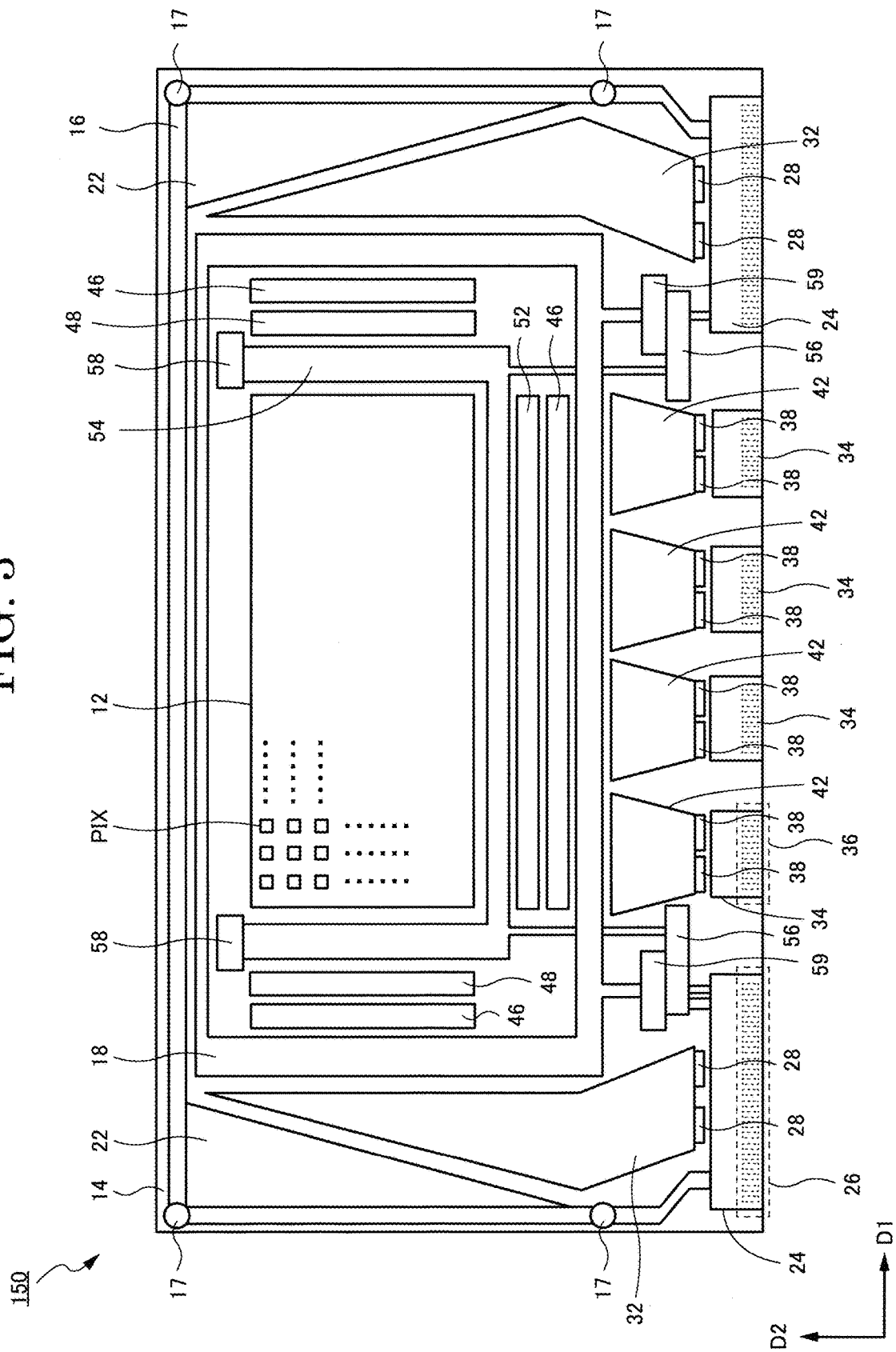
FIG. 3 is a plan view showing a configuration of a first substrate of a display device according to an embodiment of the present invention.

FIG. 3 is a plan view showing a configuration of the array substrate 150 of the display device 10 according to the embodiment of the present invention. As shown in FIG. 3, the array substrate 150 includes the display area 12 and the peripheral area 14.

The display area 12 includes the plurality of pixels PIX arranged in a matrix. Each of the plurality of pixels PIX has a plurality of transistors and liquid crystal elements.

The peripheral area 14 is arranged so as to surround the display area 12. In addition, the peripheral area 14 refers to an area from the display area 12 to an end portion of the array substrate 150 in the array substrate 150. In other words, the peripheral area 14 refers to an area other than an area where the display area 12 is arranged on the array substrate 150 (that is, an area outside the display area 12).

In the peripheral area 14, in addition to the gate driving circuit 28 and the source driving circuit 38, the gate wiring area 32, the source wiring area 42, common wirings 16 and 18, terminal parts 26 and 36, flexible printed circuits 24 and 34, and various inspection circuits are arranged. The terminal parts 26 and 36 are arranged along one side of the array substrate 150.

The flexible printed circuit 24 is connected to the terminal part 26. The flexible printed circuit 24 supplies various signals to the gate driving circuit 28, the common wirings 16 and 18, an ESD protection circuit 59 (including a short ring SR), and a QD pad 56. The gate driving circuit 28 is connected to a plurality of gate wirings GL, and each of the plurality of gate wirings GL is electrically connected to each of the plurality of pixels PIX in the display area 12. FIG. 3 represents the area where the plurality of gate wirings GL are arranged as gate wiring region 32, and the detailed arrangement of the plurality of gate wirings GL is omitted from the figure. The number of gate wirings GL connected to two gate driving circuits 28 corresponds to the number of rows of the pixels PIX in the display area 12. In FIG. 3, although the gate wiring area 32 is spaced apart from the display area 12, actually, the gate wiring GL and the pixel PIX are electrically connected to each other.

The flexible printed circuit 34 is connected to the terminal part 36. The flexible printed circuit 34 supplies a video signal to the source driving circuit 38. The source driving circuit 38 is connected to a plurality of source wirings SL, and each of the plurality of source wirings SL is electrically connected to each of the plurality of pixels PIX in the display area 12. In FIG. 3, an area in which a plurality of source wirings SL are arranged is represented as the source wiring area 42, and a detailed arrangement of the plurality of source wirings SL is omitted. In addition, in FIG. 3, although the source wiring area 42 is spaced apart from the display area 12, actually, the source wiring SL and the pixel PIX are electrically connected to each other.

The common wiring 18, an ESD protection circuit 46, a gate inspection circuit 48, and an inspection line 54 are arranged between the gate wiring area 32 and the display area 12. The common wiring 18, the ESD protection circuit 46, a source inspection circuit 52, and the inspection line 54 are arranged between the source wiring area 42 and the display area 12. The inspection line 54 is connected to an ESD protection circuit 58 and the QD pad 56. Furthermore, the common wiring 18 is connected to the ESD protection circuit 59. In addition, in this specification and the like, the gate inspection circuit 48, the source inspection circuit 52, the inspection line 54, the ESD protection circuit 46, and the like arranged in the peripheral area 14 are referred to as peripheral circuits.

The common wiring 16 is arranged so as to surround the peripheral area 14 of the array substrate 150, and signals are supplied from two flexible printed circuits 24. The common wiring 16 is electrically connected to the lattice common wiring area 22. At four corners of the array substrate 150, a connecting part 17 is arranged in the common wiring 16. The connecting part 17 connects the common wiring 16 of the array substrate 150 and a common electrode arranged on the entire surface of the opposing substrate 152.

The display device 10 can be applied to a high-speed driving panel such as a transparent display or a large high-definition panel. Here, the transparent display is a display in which a display image is overlapped and a background on the opposing substrate 152 side is visually recognized when the panel is visually recognized from the array substrate 150 side, and a display image is overlapped and a background on the array substrate 150 side is visually recognized when the panel is visually recognized from the opposing substrate 152 side.

In a transparent display, a peripheral circuit is arranged between a display area arranged on an array substrate side and a gate wiring area. A black matrix arranged on an opposing substrate side as disclosed in Patent Literature 2 is formed only in the display area. The reflection of light by wiring or the like in the display area is suppressed by arranging the black matrix in the display area. On the other hand, the peripheral area (non-display area) is not covered with a black matrix in order to make the background visible. The peripheral circuit not covered by the black matrix does not suppress the reflection of light such as wiring. Materials arranged on a resurface of the peripheral circuit arranged on the array substrate are different from materials of the black matrix arranged on the opposing substrate. Therefore, a color is changed due to the difference in material when viewed from the opposing substrate side. Further, a wiring density of the peripheral circuit is higher than a wiring density in the display area. As a result, an area of the peripheral circuit becomes conspicuous in the transparent display.

Therefore, one object of the display device 10 according to an embodiment of the present invention is to make a boundary between the display area and the non-display area seamless. Specifically, a wiring density in the display area 12 and a wiring density of the peripheral circuits (various inspection circuits and protection circuits) are set to be substantially the same, and the peripheral circuits are covered with a lattice black matrix similar to that of the display area. Further, the peripheral circuit is arranged so as to overlap a lattice black matrix BM. As a result, the transparency of the peripheral area 14 can be increased to the same level as that of the display area 12.

Figure 4:
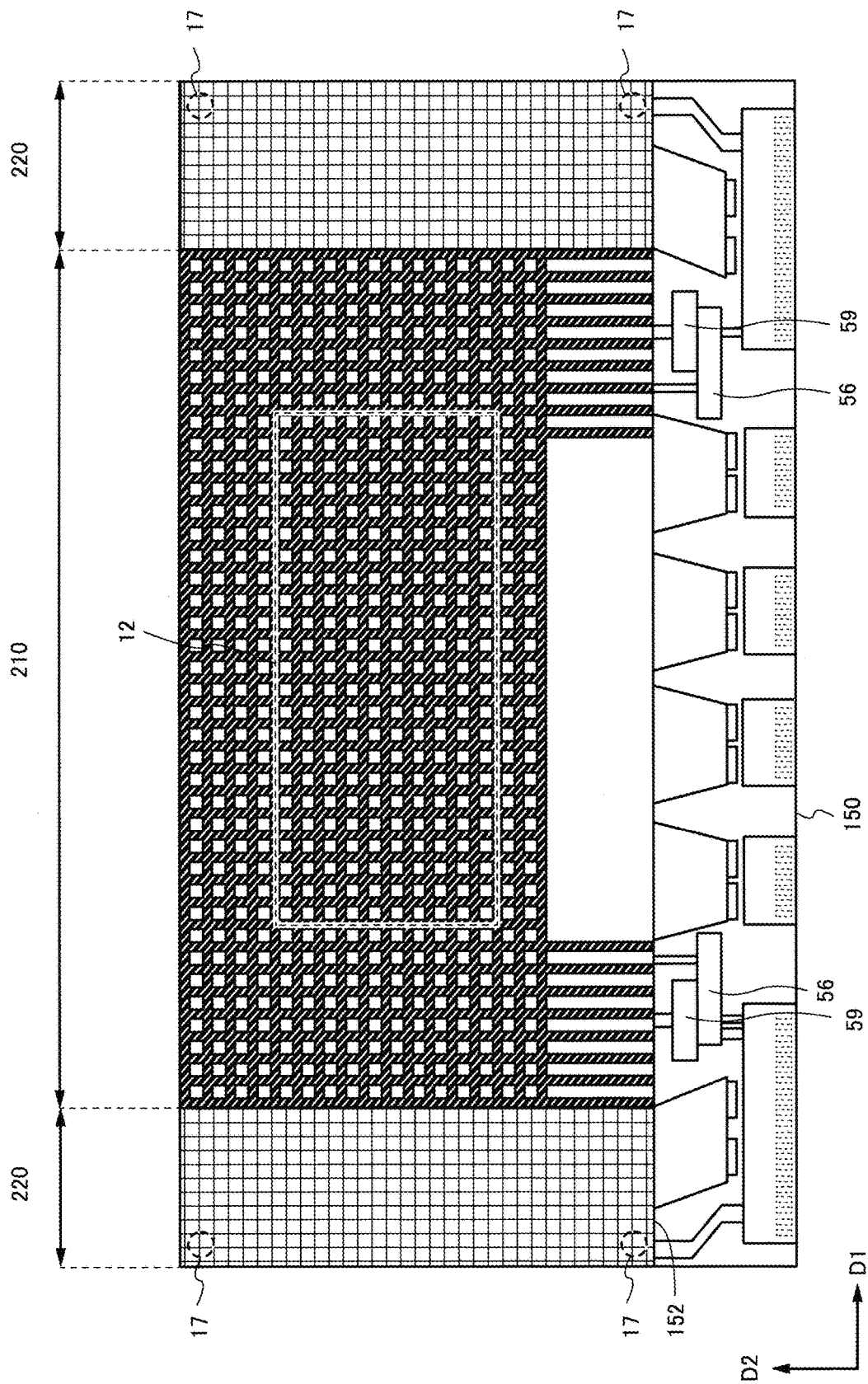
FIG. 4 is a plan view showing a configuration of a second substrate of a display device according to an embodiment of the present invention.

FIG. 4 is referred to in order to explain a configuration of the black matrix BM in the case where the panel is viewed from the opposing substrate 152. FIG. 4 is a plan view showing a configuration of the opposing substrate 152 of the display device 10 according to an embodiment of the present invention. As shown in FIG. 4, the black matrix BM is arranged in lattice in the opposing substrate 152.

The black matrix BM has a first lattice area 210 and a second lattice area 220. A lattice area is an area formed by intersecting two parallel linear groups extending in different directions. In the lattice area, an intersection of two linear groups extending in different directions is called a lattice point. Further, a section between two adjacent lattice points in the lattice area is referred to as a linear section. The first lattice area 210 is an area overlapping the display area 12, the various inspection circuits, and the common wiring 18, in the array substrate 150. The second lattice area 220 is an area overlapping the gate wiring area 32 and the common wiring area 22.

In FIG. 4, although the first lattice area 210 in the black matrix BM overlaps the ESD protection circuit 46, the gate inspection circuit 48, the inspection line 54, and the common line 18, and does not overlap the source inspection circuit 52 and the ESD protection circuit 46, the first lattice area 210 is not limited to this configuration. The first lattice area 210 may overlap the source inspection circuit 52 and the ESD protection circuit 46.

[Cross-Sectional Structure of Pixel]

Figure 5:
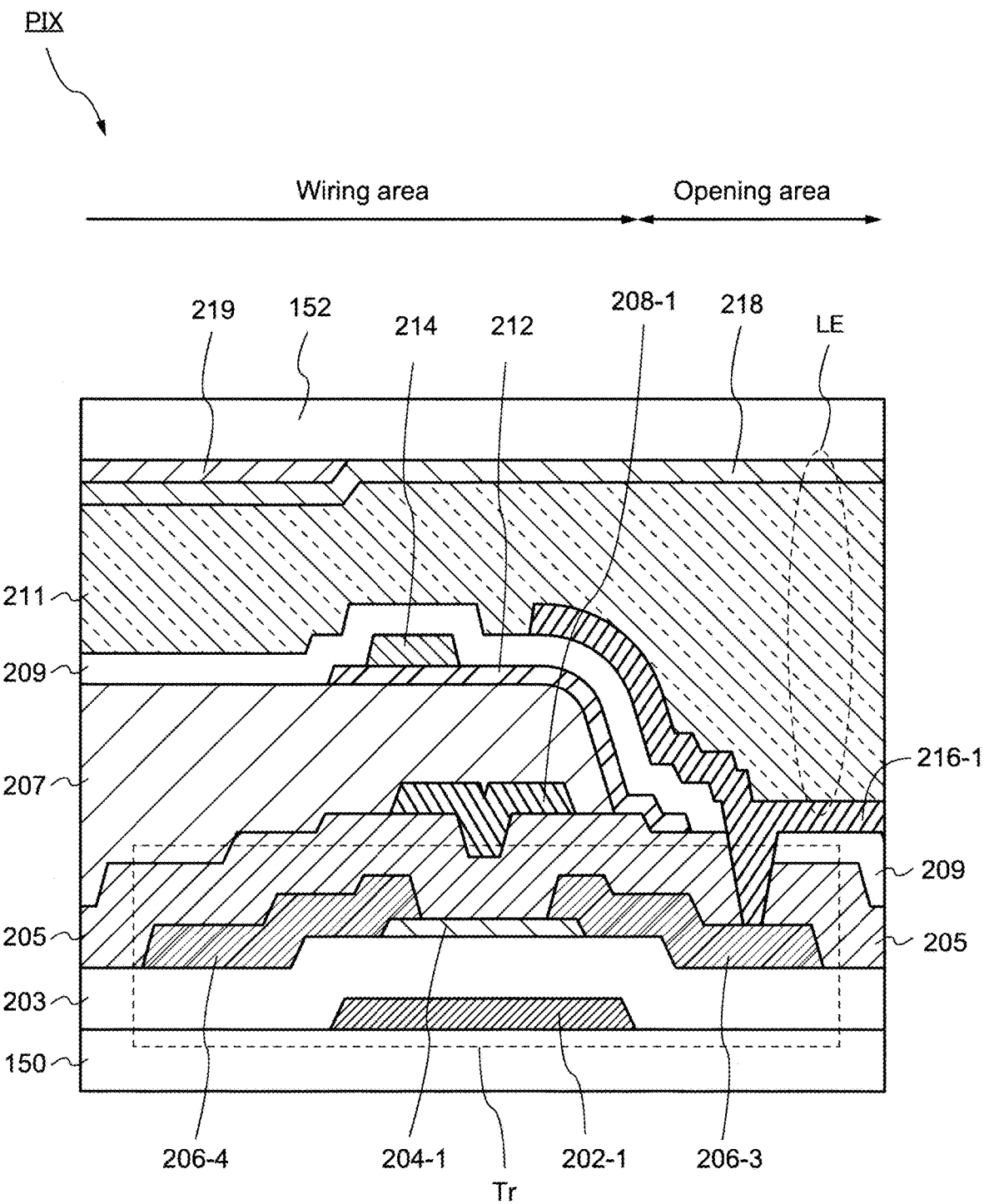
FIG. 5 is a cross-sectional view of pixels in a display device according to an embodiment of the present invention.

A configuration of a display device 10 according to an embodiment of the present invention will be described with reference to FIG. 5. FIG. 5 is a cross-sectional view of the pixel PIX in the display device 10 according to an embodiment of the present invention.

As shown in FIG. 5, a transistor Tr is arranged on the array substrate 150. The transistor Tr includes a first conductive layer 202-1 arranged on the array substrate 150, an oxide semiconductor layer 204-1 arranged facing the first conductive layer 202-1, a gate insulating film 203 arranged between the first conductive layer 202-1 and the oxide semiconductor layer 204-1, and a second conductive layer 206-3 and a second conductive layer 206-4 arranged on the oxide semiconductor layer 204-1. Here, the first conductive layer 202-1 functions as the gate wiring GL (gate electrode), and the second conductive layer 206-4 functions as the source wiring SL (source electrode).

An insulating film 205 is arranged on the transistor Tr. On the insulating film 205, a third conductive layer 208-1 is arranged on a position facing the oxide semiconductor layer 204-1. The third conductive layer 208-1 functions as a back gate electrode. In the present embodiment, the transistor Tr is described as a bottom gate driven transistor, but the present invention is not limited thereto, and may be a top gate driven transistor or a dual gate driven transistor.

A planarization film 207 is arranged on the third conductive layer 208-1 and the insulating layer 205. The planarization film 207 is arranged to alleviate unevenness of various wirings constituting the transistor Tr. The planarization film 207 is preferably removed in an opening area of the pixel PIX in the case where the display device 10 is applied to a transparent display. As a result, the light can be suppressed from being absorbed by the planarizing film 207 in the opening area.

A transparent conductive layer 212 is arranged on the planarization film 207 and the insulating film 205. A fourth conductive layer 214 is arranged on the transparent conductive layer 212. The transparent conductive layer 212 and the fourth conductive layer 214 function as capacitance wirings. An insulating film 209 is arranged on the transparent conductive layer 212 and the fourth conductive layer 214. A pixel electrode 216-1 is arranged on the insulating film 209. The pixel electrode 216-1 is connected to the second conductive layer 206-3 via openings arranged in the insulating films 205 and 209.

The opposing substrate 152 is arranged so as to face the array substrate 150. A light-shielding layer 219 and the common electrode 218 is arranged in the opposing substrate 152. The light-shielding layer 219 function as a black matrix BM. In the structure shown in FIG. 5, the light-shielding layer 219 is arranged in an area overlapping the conductive layer 206-4. The light-shielding layer 219 is arranged in a lattice so as to cover the gate wiring GL and a source wiring SL1 to a source wiring SL4. The common electrode 218 has a size extending over an entire surface of the display area 112. The light-shielding layer 219 may be formed of a metal film. The light-shielding layer 219 functions as an auxiliary electrode by being arranged in contact with the common electrode 218 formed of a transparent conductive film. A liquid crystal layer 211 is arranged between the array substrate 150 and the opposing substrate 152, and is sealed with the sealing material 154 (see FIG. 1). The pixel electrode 216-1, the liquid crystal layer 211, and the common electrode 218 constitute a liquid crystal element LE.

[Configuration of Peripheral Area]

Next, a configuration in which the first lattice area 210 and the second lattice area 220 in the peripheral area 14 are enlarged will be described with reference to FIG. 6 to FIG. 9.

Figure 6:
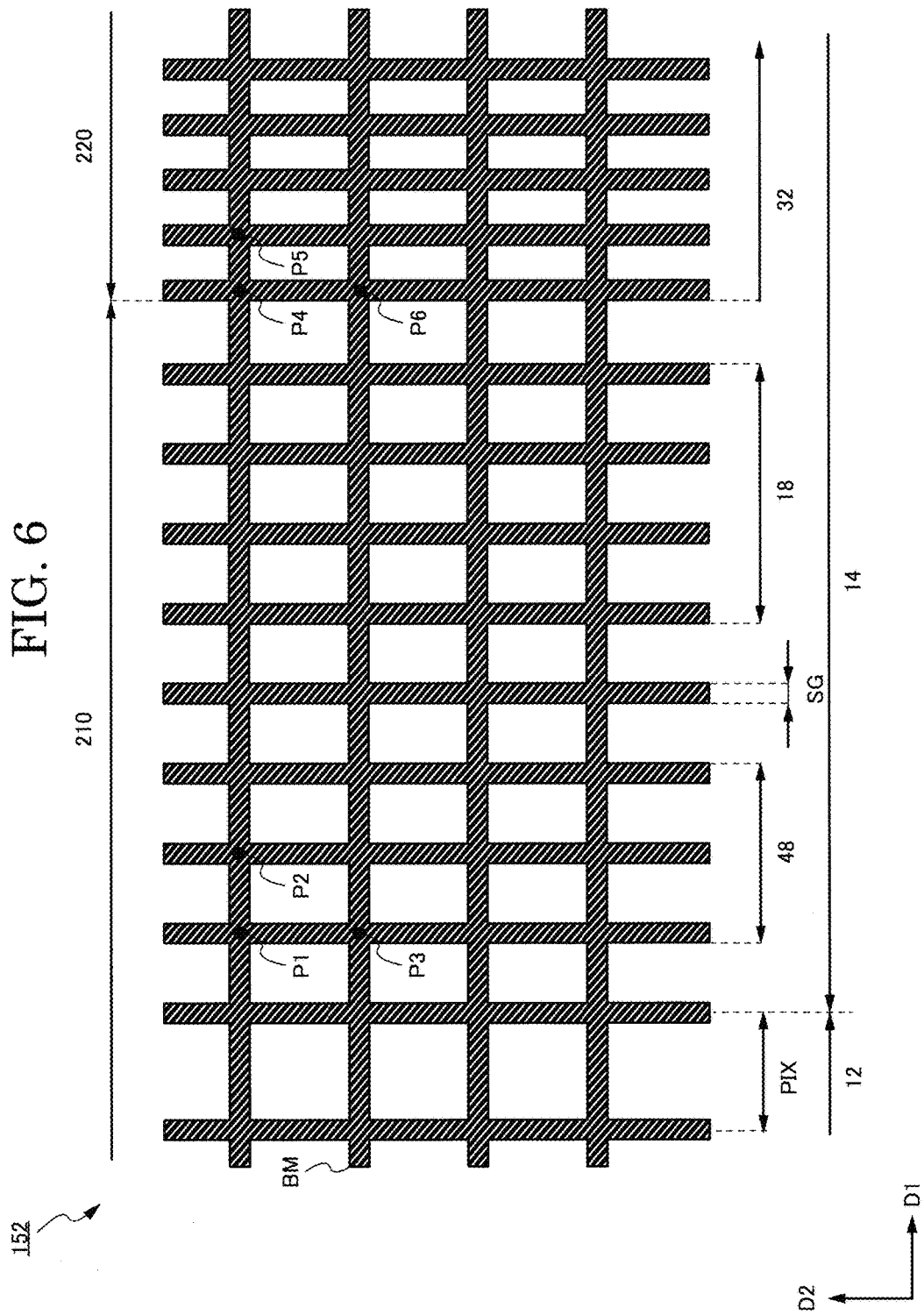
FIG. 6 is a planar layout of a black matrix arranged on a second substrate.

FIG. 6 is an enlarged view of the first lattice area 210 and the second lattice area 220 in the black matrix BM (corresponding to the light-shielding layer 219 shown in FIG. 5) arranged on the opposing substrate 152. In addition, FIG. 6 is a plan view of the opposing substrate 152 when viewed from a surface opposite to a surface on which the black matrix BM is formed. As shown in FIG. 6, the first lattice area 210 in the black matrix BM overlaps the pixel PIX in the display area 12, the gate inspection circuit 48 in the peripheral area 14, a short ring SG (ESD protection circuit 46), and the common wiring 18. The second lattice area 220 overlaps the gate wiring area 32.

In the first lattice area 210, a distance between the two lattice points P1 and P2 adjacent to each other in the direction D1 corresponds to a distance between two adjacent wirings extending in the direction D2 arranged in the array substrate 150. Further, in the first lattice area 210, a distance between two lattice points P1 and P3 adjacent in the direction D2 corresponds to a distance between two adjacent wirings extending in the direction D1 arranged in the array substrate 150. In the second lattice area 220, a distance between two lattice points P4 and P5 adjacent in the direction D1 corresponds to a distance between two gate wirings GL in the direction D2 arranged in the array substrate 150. In the second lattice area 220, a distance between the two lattice points P4 and P6 adjacent in the direction D2 correspond to a distance between two gate wirings GL in the direction D1 arranged in the array substrate 150.

In the first lattice area 210, the distance between the two lattice points P1 and P2 adjacent to each other in the direction D1 may be larger than the distance between the two adjacent lattice points P4 and P5 of the second lattice area 220. In other words, a length of a linear section extending in the first direction of the lattice in the first lattice area 210 may be longer than a length of a linear section extending in the first direction of the lattice in the second lattice area.

Although not specifically shown, a plurality of gate wirings GL and a plurality of source wirings SL are arranged in the display area 12. The plurality of gate wirings GL extend in the direction D1, and the plurality of source wirings SL extend in the direction D2. The plurality of gate wirings GL and the plurality of source wirings SL are arranged in a grid pattern in the display area 12. The plurality of gate wirings GL and the plurality of source wirings SL are arranged so as to overlap the first lattice area 210 of the black matrix BM.

The distance between two adjacent source wirings SL corresponds to a length of a linear section extending in the direction D1 in the first lattice area 210 of the black matrix BM. In addition, a distance between the two adjacent gate wirings GL corresponds to a length of the linear section extending in the direction D2 in the first lattice areas 210 of the black matrix BM.

The distance between the two adjacent source wirings SL may be the same as or different from a distance between two adjacent signal lines S. The distance between the two adjacent source wirings SL and the distance between the two adjacent signal lines S are generally the same, allowing the wiring density in the display area 12 and the wiring density in the peripheral area 14 to be generally the same. In other words, a difference between a density of the black matrix BM in the display area 12 and a density of the black matrix BM in the peripheral area 14 is preferably 10% or less. For example, it is preferable that the density of the black matrix BM in the display area 12 differs from a density of the black matrix BM in the first lattice area 210 by 10% or less. A linear section of the black matrix BM may differ in width between the display area 12 and the peripheral area 14. For example, a width of the linear section extending in the direction D1 in the display area 12 is 10 μm or less, and a width of the linear section extending in the direction D2 is 25 μm or less, and preferably 10 μm or less. Further, a width of the linear section extending in the direction D1 in the peripheral area 14 is 10 μm or less, and a width of the linear section extending in the direction D2 is 25 μm or less, and preferably 10 μm or less. The density of the black matrix BM may be determined by an area occupied by the black matrix BM in an area of 1 mm×1 mm in the display area 12 or the peripheral area 14.

The second lattice area 220 is an area overlapping the gate wiring area 32 and the mesh-shaped common wiring area 22 formed on the array substrate 150. Wiring densities of the gate wiring area 32 and the mesh-shaped common wiring area 22 may be higher than wiring densities of a gate inspection circuit and an ESD protection circuit. Therefore, a density of a black matrix BM in the second lattice area 220 may be higher than the density of the black matrix BM in the first lattice area 210. For example, a difference between the density of the black matrix BM in the first lattice area 210 and the density of the black matrix BM in the second lattice area 220 is not limited to 10% or less, and may be more than 10%.

Figure 7:
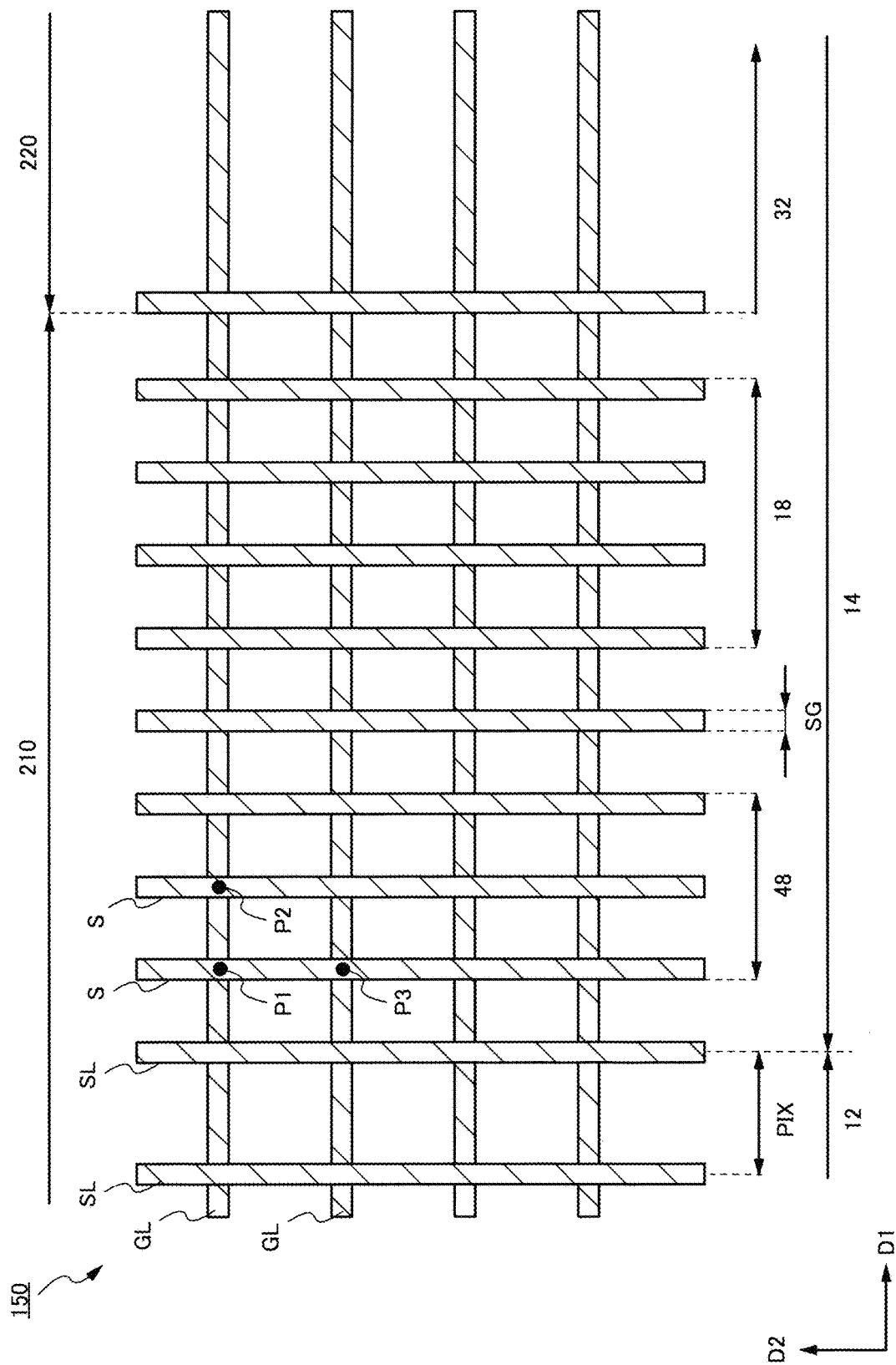
FIG. 7 is an enlarged view of pixels, a gate inspection circuit, a short ring, a common wiring, and a gate wiring arranged on a first substrate.

FIG. 7 is an enlarged view of the pixel PIX, the gate inspection circuit 48, the short ring SG, the common wiring 18, and the gate wiring GL (the gate wiring area 32) arranged on the array substrate 150. In addition, FIG. 7 is a plan view of the array substrate 150 when viewed from a side where the pixel PIX, the gate inspecting circuit 48, the short ring SG, the common wiring 18, and the gate wiring GL are formed. In FIG. 7, the wirings extending in the direction D1 are shown as being arranged in layers different from the wirings extending in the direction D2 for ease of explanation. Detailed configurations of the pixel PIX, the gate inspection circuit 48, the short ring SG, and the common wiring 18 will be described later with reference to FIG. 10 to FIG. 17.

As shown in FIG. 7, the plurality of gate wirings GL extend at intervals in the direction D1, and the plurality of signal lines S extend at intervals in the direction D2 in the peripheral area 14. In the display area 12, the plurality of source wirings SL extend at intervals in the direction D2. However, detailed illustrations are omitted. For example, in the gate inspection circuit 48, a transistor is arranged at an intersection of the gate wiring GL and the signal line S. The short ring SG is arranged along the direction D2 as the signal line S. The first lattice area 210 in the black matrix BM overlaps the pixel PIX in the display area 12, the gate inspection circuit 48 in the peripheral area 14, the short ring SG, and the common line 18. The second lattice area 220 overlaps the gate wiring area 32. Therefore, the linear section extending in the direction D1 in the black matrix BM overlaps the gate wiring GL extending in the direction D1 in the array substrate 150, and the linear section extending in the direction D2 in the black matrix BM overlaps the signal line S extending in the direction D2 in the array substrate 150.

Although not specifically shown, a line width (length in the direction D1) of the lattice in the linear section extending in the direction D2 is longer than a length in the direction D1 of the wiring extending in the direction D2 in the array substrate 150 in the black matrix BM. Similarly, a line width (length in the direction D2) of the lattice in the linear sections extending in the direction D1 is larger than a length in the direction D2 of the wiring extending in the direction D1 in the array substrate 150 in the black matrix BM. That is, the black matrix BM covers the wirings arranged on the array substrate 150.

Figure 8:
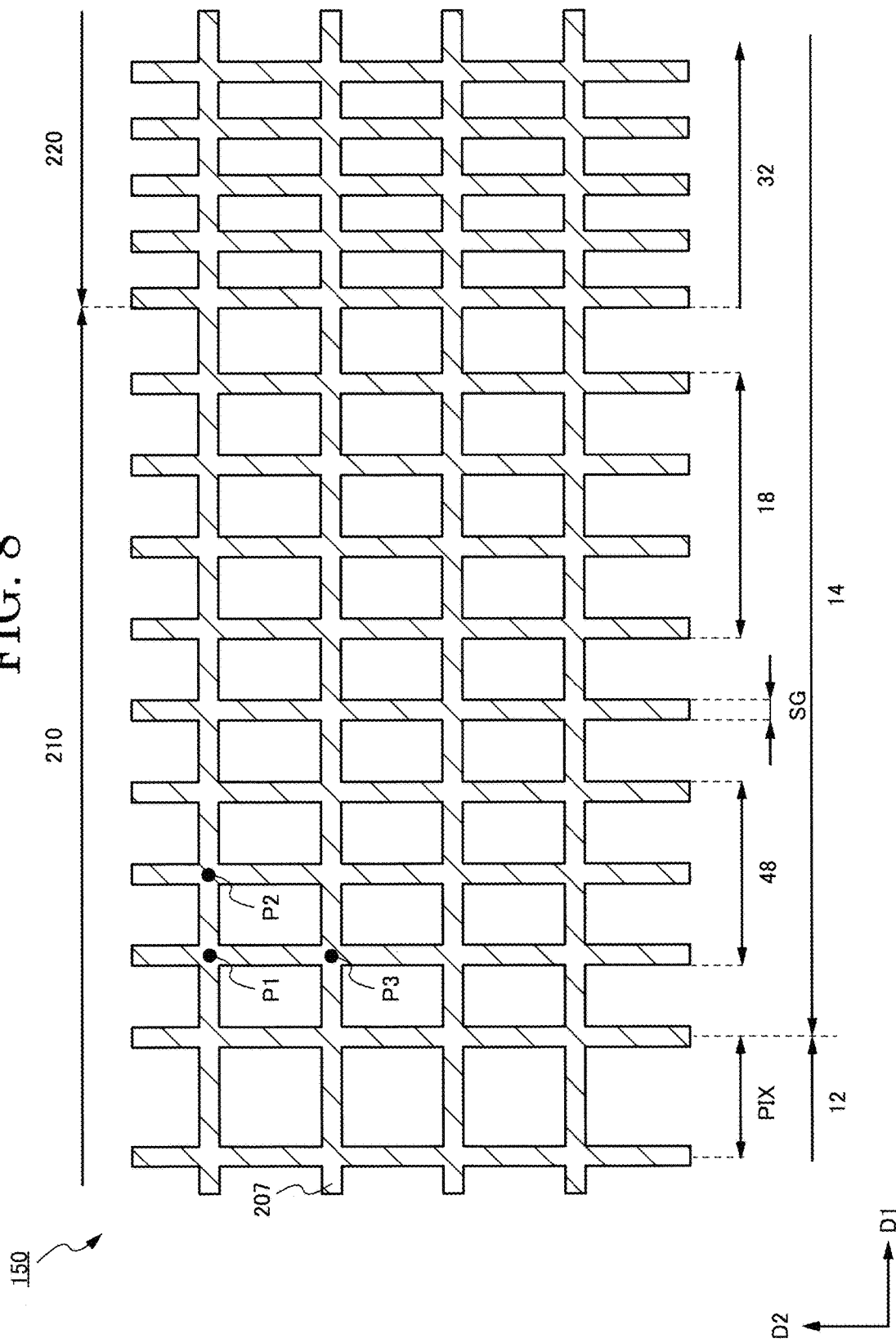
FIG. 8 is an enlarged view of a planarization film arranged on pixels, a gate inspection circuit, a short ring, a common wiring, and a gate wiring arranged on a first substrate.

FIG. 8 is an enlarged view of the planarization film 207 arranged on the pixel PIX, the gate inspecting circuit 48, the short ring SG, the common wiring 18, and the gate wiring GL (the gate wiring area 32). FIG. 8 is a plan view of the array substrate 150 when viewed from a side where the planarization film 207 arranged on the pixel PIX, the gate inspection circuit 48, the short ring SG, the common wiring 18, and the gate wiring GL is formed. As shown in FIG. 8, the planarization film 207 is arranged in lattice similar to that of the black matrix BM. That is, the planarization film 207 is not arranged in an area other than various wirings constituting the pixel PIX, the gate inspection circuit 48, the short ring SG, the common wiring 18, and the gate wiring GL.

The planarization film 207 is arranged in a lattice so as to overlap an area in which the gate wiring GL and the source wiring SL are arranged in the display area 12. The lattice area of the planarization film 207 overlaps the lattice area of the black matrix BM. As described above, the light emitted from the light source 104 can be prevented from being absorbed by the planarization film 207 by removing the planarization film 207 in the area where no wiring is arranged in the display area 12. In addition, a color can be prevented from changing between the display area 12 and the peripheral area 14 by removing the planarization film 207 in an area where no wiring is arranged in the peripheral area 14 as in the case of the display area 12.

Figure 9:
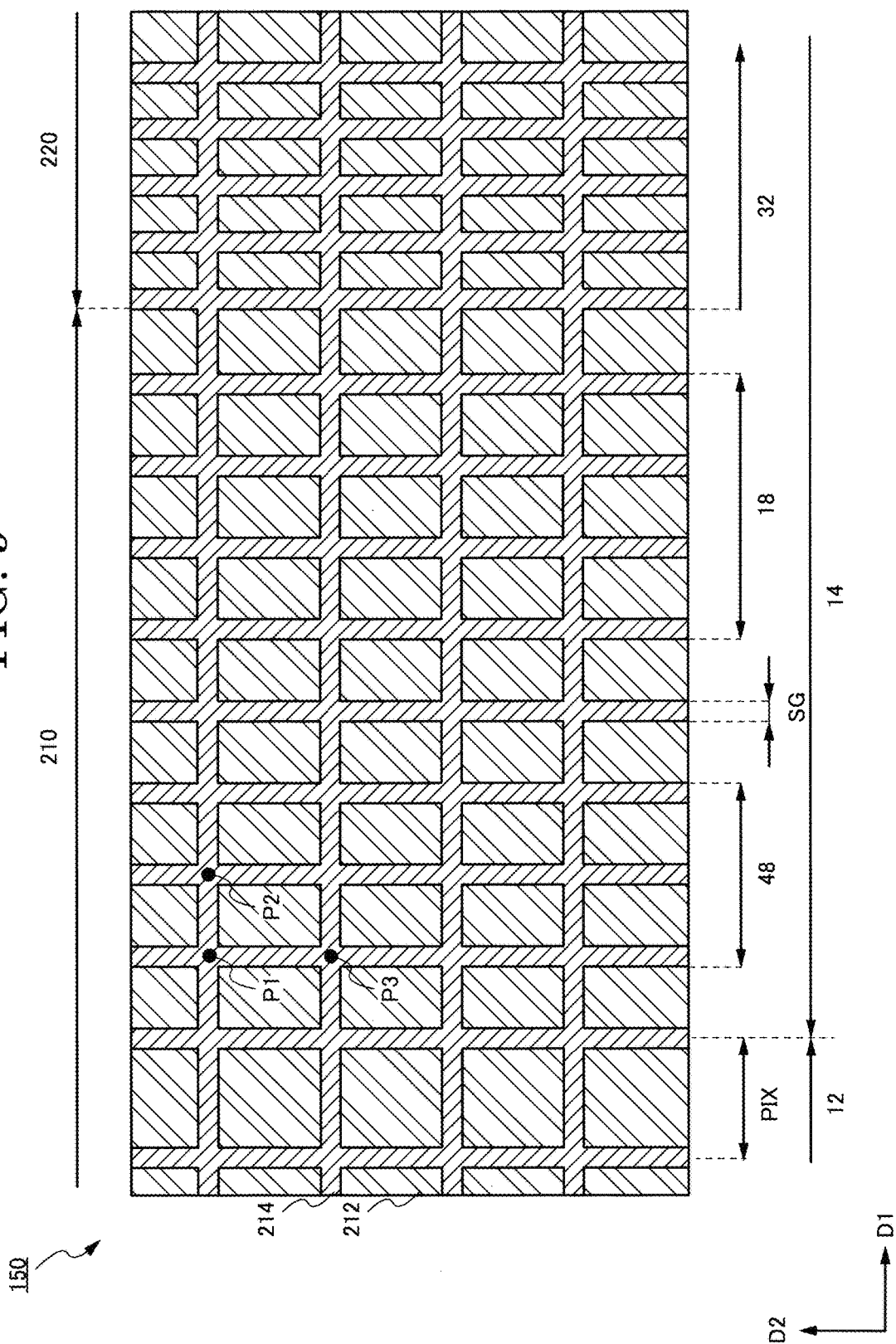
FIG. 9 is an enlarged view of a transparent conductive layer and a fourth conductive layer arranged on a gate wiring, pixels, a gate inspection circuit, a short ring, and a common wiring arranged on a first substrate.

FIG. 9 is an enlarged view of the transparent conductive layer 212 and the fourth conductive layer 214 arranged on the pixel PIX, the gate inspection circuit 48, the short ring SG, the common wiring 18, and the gate wiring GL (gate wiring area 32). FIG. 9 is a plan view of the array substrate 150 when viewed from a side where the transparent conductive layer 212 and the fourth conductive layer 214 arranged on the pixel PIX, the gate inspection circuit 48, the short ring SG, the common wiring 18, and the gate wiring GL are formed. As shown in FIG. 9, the transparent conductive layer 212 is arranged on the entire surface of the array substrate 150. In addition, the fourth conductive layer 214 is arranged in a lattice similar to the black matrix BM. That is, the fourth conductive layer 214 is not arranged in an area other than various wirings constituting the pixel PIX, the gate inspection circuit 48, the short ring SG, the common wiring 18, and the gate wiring GL.

As shown in FIG. 9, the first lattice area 210 in the black matrix BM overlaps the pixel PIX in the display area 12, the gate inspection circuit 48 in the peripheral area 14, the short ring SG, and the fourth conductive layer 214 in the common line 18. That is, the lattice area of the fourth conductive layer 214 overlaps the lattice area of the black matrix BM. The second lattice area 220 overlaps the fourth conductive layer 214 in the gate wiring area 32.

Although not shown in detail, in the black matrix BM, a length in the direction D1 of an area extending in the direction D2 is greater than a length in the direction D1 of the fourth conductive layer 214 extending in the direction D2 in the array substrate 150. Similarly, in the black matrix BM, a length in the direction D2 of an area extending in the direction D1 is greater than a length in the direction D2 of the fourth conductive layer 214 extending in the direction D1 in the array substrate 150. That is, the fourth conductive layer 214 arranged on the array substrate 150 is covered by the black matrix BM.

Next, a detailed description of configurations of the gate inspection circuit 48 and the short ring SG arranged in the peripheral area 14 will be explained referring to FIG. 10 to FIG. 17.

[Configuration of Gate Inspection Circuit]

Figure 10:
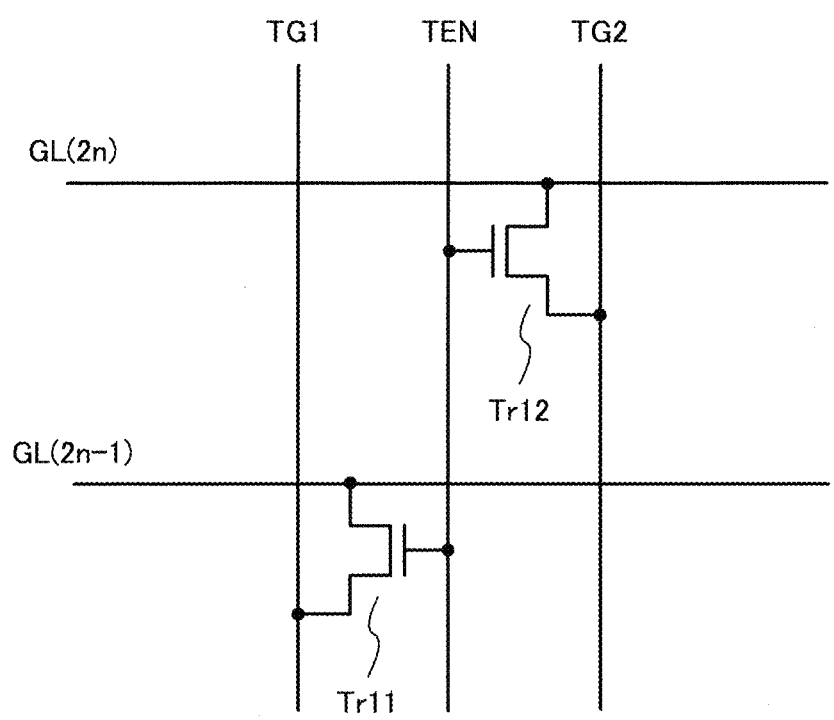
FIG. 10 is a circuit diagram of a gate inspection circuit arranged in a peripheral area.

FIG. 10 is a circuit diagram of the gate inspection circuit 48 arranged in the peripheral area. A gate of a transistor Tr11 and a gate of a transistor Tr12 are connected to a wiring TEN. The wiring TEN is a wiring for controlling an on-state or an off-state of the transistors Tr11 and Tr12. Further, a wiring TG1 is connected to a source of the transistor Tr11. The wiring TG1 is a wiring for supplying a signal to a transistor arranged in an odd-numbered row. Therefore, if the signal is supplied from the signal TG1 when the transistor Tr11 is in the on-state, a current can flow through the gate wiring GL (2n−1) (n≥1). Further, a wiring TG2 is connected to a source of the transistor Tr12. The wiring TG2 is a wiring for supplying a signal to a transistor arranged in an even-numbered row. Therefore, if a signal is supplied from the signal TG2 in the case where the transistor Tr12 is in the on-state, a current can flow through the gate wiring GL (2n) (n≥1). As a result, the transistor Tr11 arranged in the odd-numbered row can be collectively inspected, and the transistor Tr12 arranged in the even-numbered row can be collectively inspected in the gate inspection circuit 48.

Figure 11:
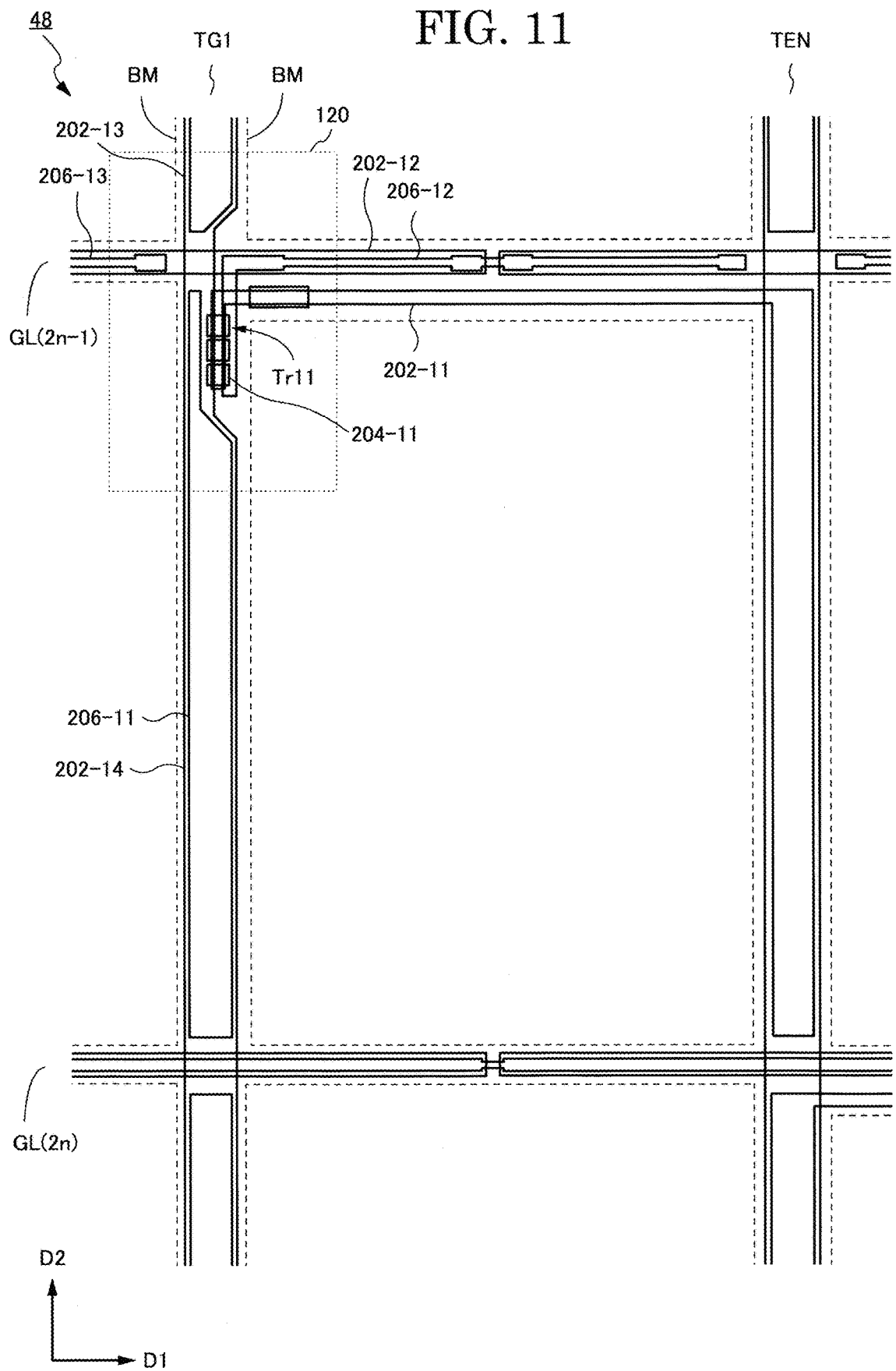
FIG. 11 is a planar layout of the gate inspection circuit.

FIG. 11 is a planar layout of the gate inspection circuit 48. In FIG. 11, the gate wiring GL (2n−1) and GL (2n) are arranged in the direction D1, and the wiring TG1 and the wiring TEN are arranged in the direction D2. Further, a gate 202-11 of the transistor Tr11 is connected to the wiring TEN, a source 206-11 is connected to the wiring TG1, and a drain 206-12 is connected to the gate wiring GL (2n−1).

FIG. 11 is a planar layout of the first conductive layer 202, the oxide semiconductor layer 204, and the second conductive layer 206. In FIG. 11, the opening arranged in the gate insulating film 203 is not shown. The first conductive layer 202 and the second conductive layer 206 are connected via an opening arranged in the gate insulating film 203 in an area where the first conductive layer 202 and the second conductive layer 206 overlap each other. For example, a first conductive layer 202-14 and the second conductive layer 206-11 are connected via the opening arranged in the gate insulating film 203 in the wiring TG1. In addition, a first conductive layer 202-12 and the second conductive layer 206-12 are connected via the opening arranged in the gate insulating film 203 in the gate wiring GL (2n−1). With such a configuration, a wiring resistance in the peripheral area 14 can be made uniform. The linear section extending in the direction D1 in the lattice area of the black matrix BM overlaps the gate wirings GL (2n−1) and GL (2n). In addition, the linear section extending in the direction D2 in the lattice area of the black matrix BM overlaps the wiring TG1 and the wiring TEN. A line width of the linear section extending in the direction D1 in the lattice area of the black matrix BM is larger than the line widths of the gate wirings GL (2n−1) and GL (2n). In addition, a line width of the linear section extending in the direction D2 in the lattice area of the black matrix BM is larger than a line width of the wiring TG1 or a line width of the wiring TEN.

Figure 12:
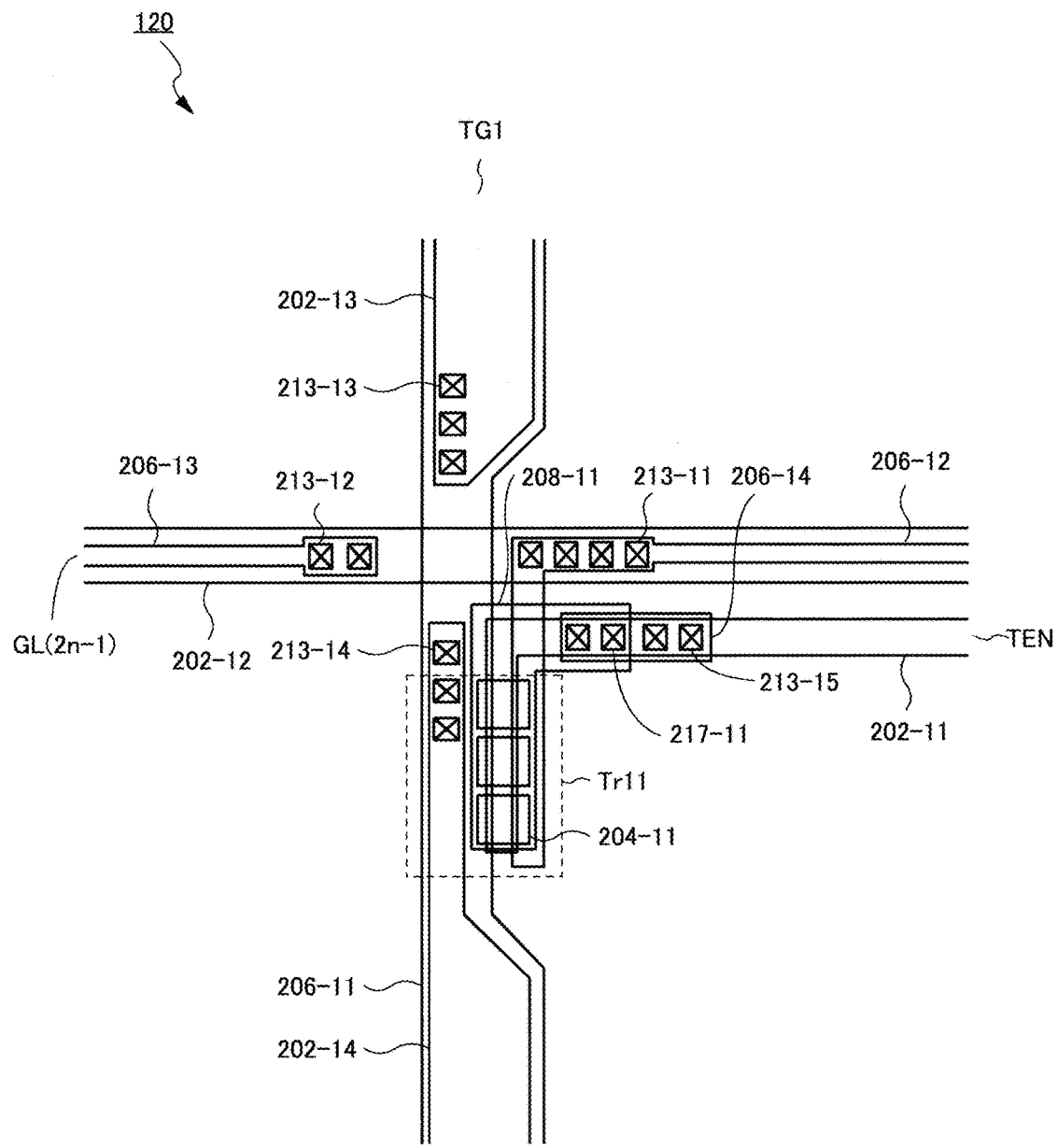
FIG. 12 is an enlarged view of an area in the gate inspection circuit of the present invention.

As shown in FIG. 12, the gate wiring GL (2n−1) is formed by stacking the conductive layer 202-12 and the conductive layers 206-12 and 206-13. In addition, only the conductive layer 202-12 is arranged in an area where the gate wiring GL (2n−1) intersects the wiring TG1, and the conductive layer 206-12 and the conductive layer 206-13 are spaced apart from each other. The wiring TG1 is formed by stacking the conductive layers 202-13 and 202-14 and the conductive layer 206-11. In addition, only the conductive layer 206-11 is arranged in an area where the wiring TG1 intersects the gate wiring GL (2n−1), and the conductive layer 202-13 and the conductive layer 202-14 are spaced apart from each other. Thus, even if static electricity is generated in a manufacturing process of the display area 12 and the peripheral area 14 in the array substrate 150, the static electricity can be released, and thus an occurrence of defects caused by the static electricity can be suppressed.

As shown in FIG. 11, the transistor Tr11 is covered with a linear section extending in the direction D2 in the lattice area of the black matrix. Further, although not shown in the drawings, the transistor Tr12 is also covered with a linear section extending in the direction D2 in the lattice area of the black matrix. In the present embodiment, although the linear section covering the transistor Tr11 is parallel to the linear section covering the transistor Tr12, the present invention is not limited thereto. The linear section covering the transistor Tr11 and the linear section covering the transistor Tr12 may intersect (or be perpendicular to) each other.

Figure 13:
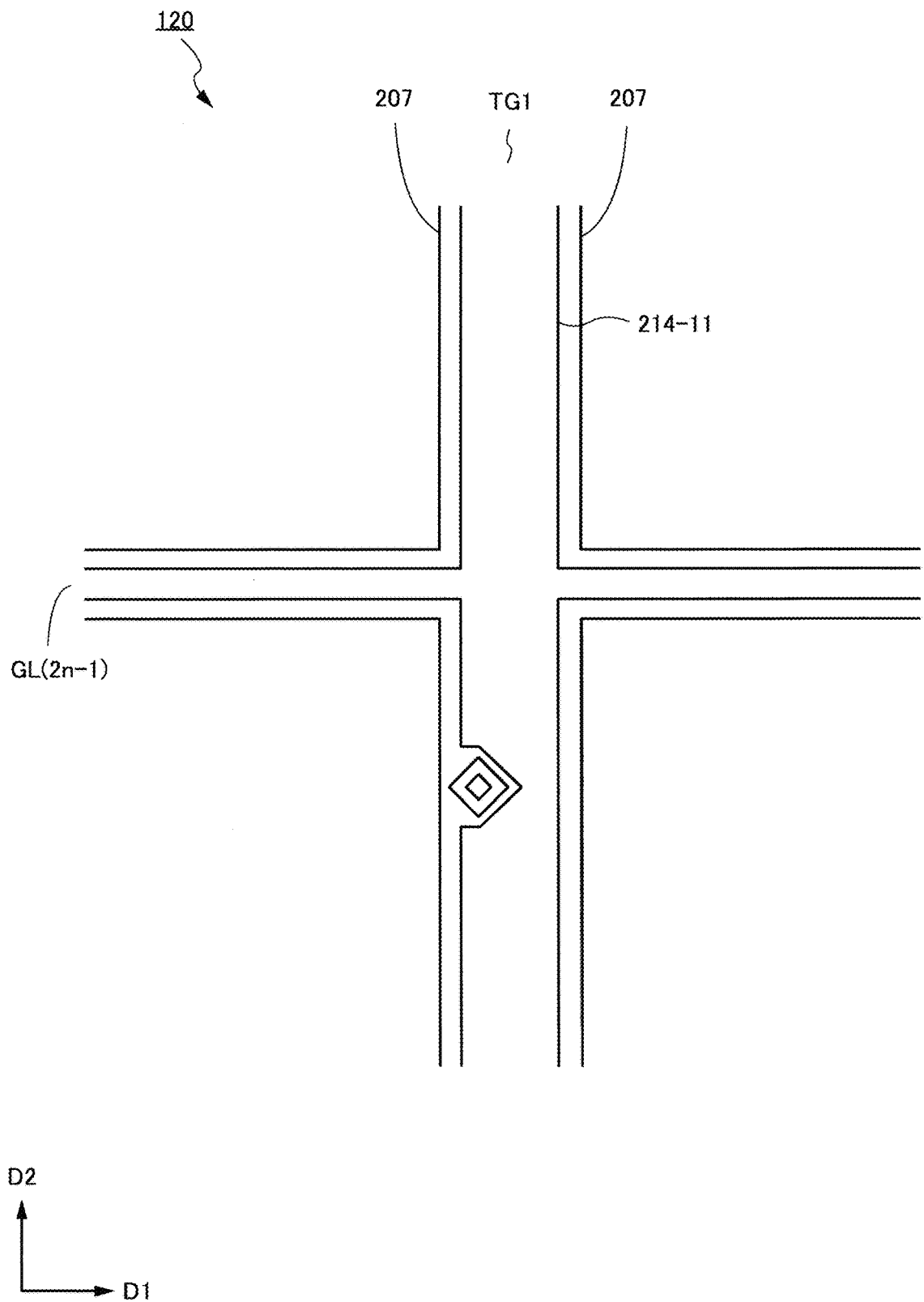
FIG. 13 is a plan view of an area including a gate inspection circuit shown in FIG. 11.

FIG. 12 and FIG. 13 are enlarged views of an area 120 including the transistor Tr11 in the gate inspection circuit 48 shown in FIG. 11. FIG. 12 is a planar layout of the first conductive layer 202, the oxide semiconductor layer 204, the second conductive layer 206, and the third conductive layer 208. The gate insulating film 203 (see FIG. 5) is arranged between the first conductive layer 202 and the oxide semiconductor layer 204. The insulating film 205 (see FIG. 5) is arranged between the second conductive layer 206 and the third conductive layer 208. FIG. 13 is a planar layout of the planarization film 207 and the fourth conductive layer 214. Since the transparent conductive layer 212 is arranged on the entire surface of the array substrate 150, illustration thereof is omitted in FIG. 13.

As shown in FIG. 12, the first conductive layer 202-11 has an area extending in the direction D1 and an area bent in the direction D2. An area of the first conductive layer 202-11 that bends in the direction D1 functions as the wiring TEN, and the area that bends in the direction D2 functions as a gate electrode of the transistor Tr11. An oxide semiconductor layer 204-11 is arranged on the area bent in the direction D2 of the first conductive layer 202-11. The second conductive layers 206-11 and 206-12 are arranged on the oxide semiconductor layer 204-11. The second conductive layers 206-11 and 206-12 are connected to the oxide semiconductor layer 204-11.

The second conductive layers 206-12 and 206-13 extend in the direction D1. The second conductive layer 206-12 is connected to the first conductive layer 202-12 via an opening 213-11 arranged in the gate insulating film 203, and the second conductive layer 206-13 is connected to the first conductive layer 202-12 via an opening 213-12 arranged in the gate insulating film 203. The first conductive layer 202-12 and the second conductive layers 206-12 and 206-13 function as the gate wirings GL (2n−1).

The first conductive layers 202-13 and 202-14 and the second conductive layer 206-11 extend in the direction D2. The first conductive layer 202-13 is connected to the second conductive layer 206-11 via an opening 213-13 arranged in the gate insulating film 203, and the first conductive layer 202-14 is connected to the second conductive layer 206-11 via an opening 213-14 arranged in the gate insulating film 203. The first conductive layers 202-13 and 202-14 and the second conductive layer 206-11 function as the wirings TG1.

A second conductive layer 206-14 is arranged on the first conductive layer 202-11. A third conductive layer 208-11 is arranged on the oxide semiconductor layer 204-11 and the second conductive layers 206-11, 206-12, and 206-14. The third conductive layer 208-11 functions as a back gate of the transistor Tr11. The third conductive layer 208-11 is connected to the second conductive layer 206-14 via the opening 217-11, and the second conductive layer 206-14 is connected to the first conductive layer 202-11 via an opening 213-15 arranged in the gate insulating film 203. Thus, the third conductive layer 208-11 is electrically connected to the first conductive layer 202-11. Therefore, a signal supplied to the wiring TEN is supplied to the gate and the back gate of the transistor Tr11.

Referring to FIG. 8 and FIG. 13, the planarization film 207 is arranged in a lattice. The planarization film 207 is arranged so as to cover the gate wirings GL (2n−1) and GL (2n), the wirings TG1 and TG2, and the wiring TEN. That is, the planarization film 207 is not arranged in an area other than the gate wirings GL (2n−1) and GL (2n), the wirings TG1 and TG2, and the wiring TEN. The planarization film 207 also covers the transistor Tr11. Referring to FIG. 8 and FIG. 13, the transparent conductive layer 212 is arranged on the entire surface of the planarization film 207. Referring to FIG. 8 and FIG. 13, a fourth conductive layer 214-11 is arranged in a lattice. The fourth conductive layer 214-11 is arranged so as to cover the gate wirings GL (2n−1) and GL (2n), the wirings TG1 and TG2, and the wiring TEN.

[Configuration of Short Ring]

Figure 14:
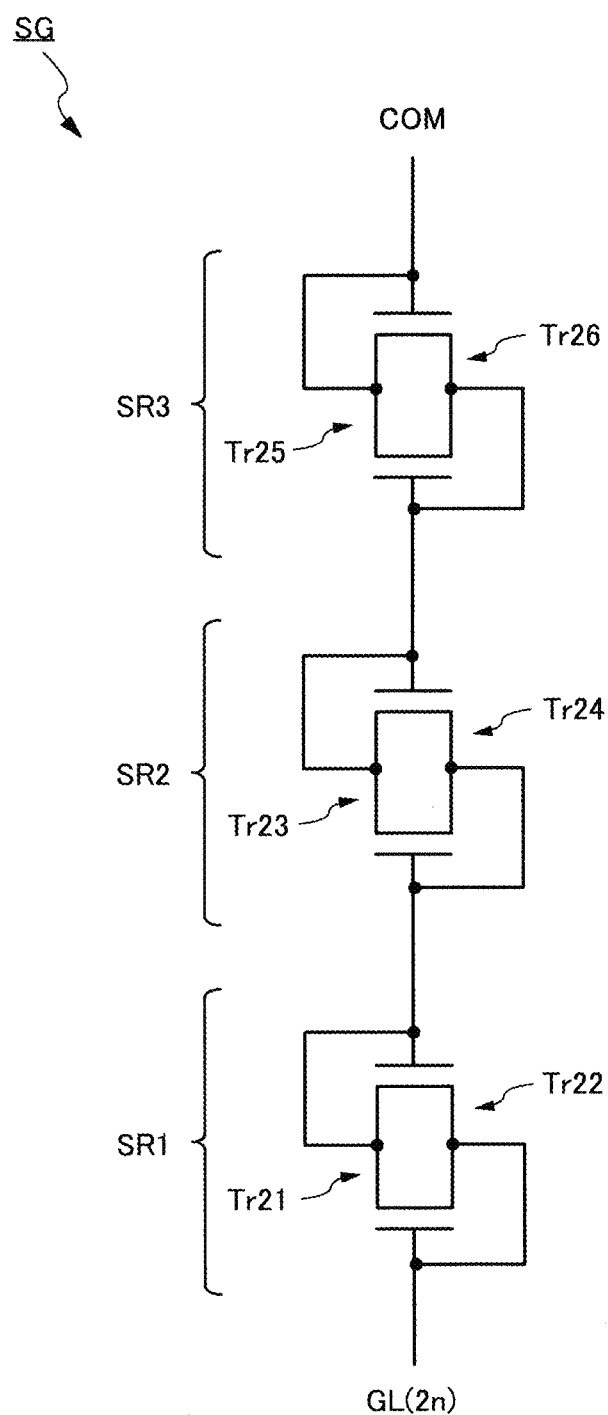
FIG. 14 is a circuit diagram of a short ring arranged in the peripheral area.

FIG. 14 is a schematic diagram of the short ring SG. The short ring SG shown in FIG. 14 is arranged in the ESD protection circuit 46 shown in FIG. 3. The short ring SG is arranged for a countermeasure to an ESD (Electro-Static Discharge). As a short ring SG, short rings SR1 to SR3 are shown.

As shown in FIG. 14, one end of the short ring SR3 is connected to the common wiring 18, and the other end of the short ring SR1 is connected to the gate wiring GL (2n). Sources and drains of transistors Tr21 and Tr22 are connected to each other, and one of the sources and the drains of the transistors Tr21 and Tr22 are connected to a gate of the transistor Tr21. The other of the sources and the drains of the transistors Tr21 and Tr22 are connected to a gate of the transistor Tr22. The gate of the transistor Tr21 is connected to the gate wiring GL (2n), and the gate of the transistor Tr22 is connected to a gate of a transistor Tr23. Thus, the short ring SR1 is formed.

Sources and drains of the transistors Tr23 and Tr24 are connected to each other, and one of the sources and the drains of the transistors Tr23 and Tr24 are connected to the gate of the transistor Tr23. The other of the sources and the drains of the transistors Tr23 and Tr24 are connected to a gate of the transistor Tr24. The gate of the transistor Tr24 is connected to a gate of a transistor Tr25. Thus, the short ring SR2 is formed.

Sources and drains of transistors Tr25 and Tr26 are connected to each other, and one of the sources and the drains of the transistors Tr25 and Tr26 are connected to gate of the transistor Tr25. The other of the sources and the drains of the transistors Tr25 and Tr26 are connected to a gate of the transistor Tr26. The gate of the transistor Tr26 is connected to the common line 18. Thus, the short ring SR3 is formed. In FIG. 14, the three short rings SR1 to SR3 are connected in series.

Thus, in the case where a large current suddenly flows through the gate wiring GL (2n) due to static electricity, charges can be released through the common wiring 18 by the three short rings SR1 to SR3.

Figure 15:
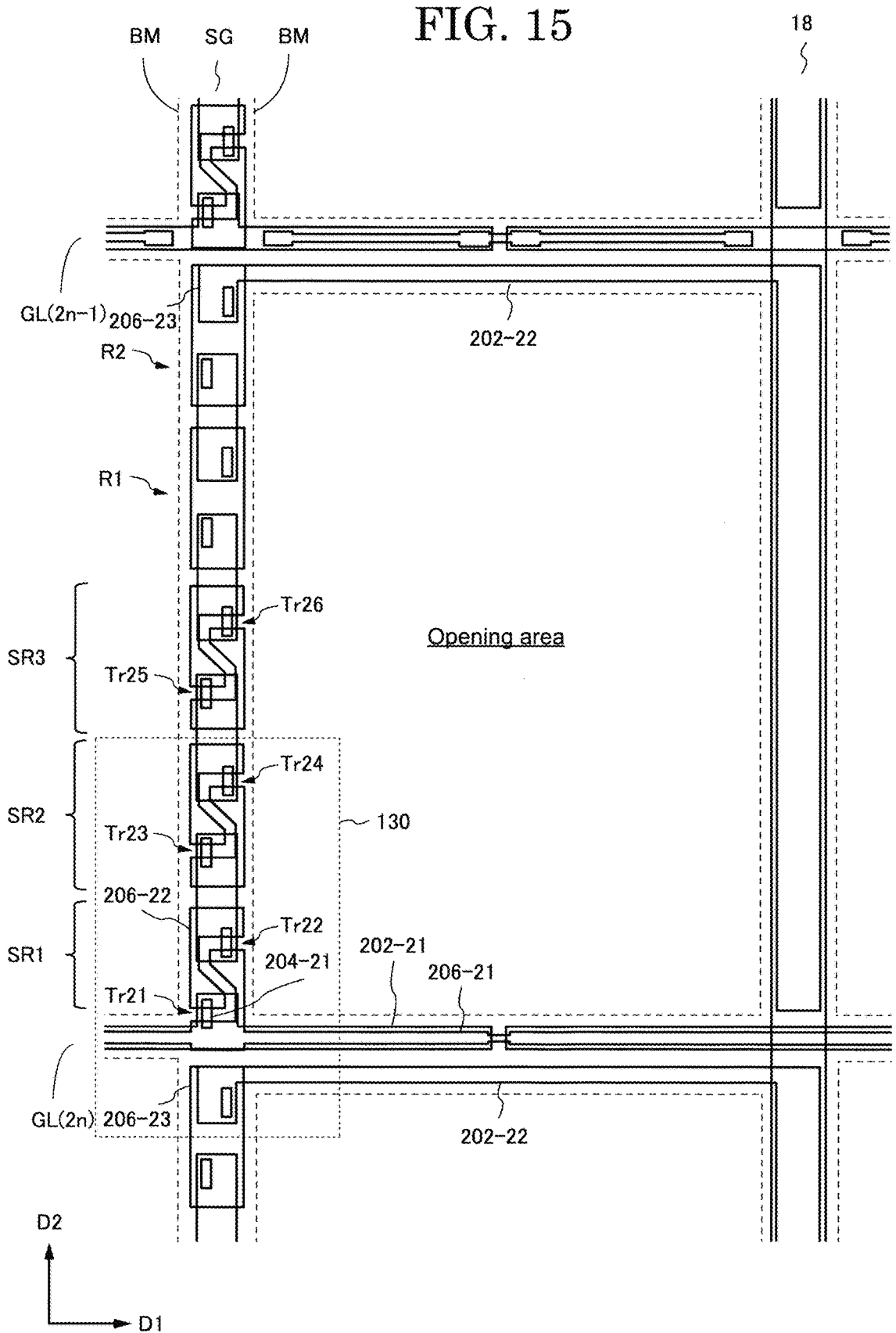
FIG. 15 is the planar layout of the short ring.

FIG. 15 is a plan view of the short rings SR1 to SR3. The short rings SR1 to SR3 are connected in series, and resistors R1 and R2 are connected in series to the short ring SR3. The short ring SR1 is connected to the gate wiring GL (2n). The resistor R2 is connected to the common wiring 18.

FIG. 15 is a planar layout of the first conductive layer 202, the oxide semiconductor layer 204, and the second conductive layer 206. The linear section extending in the direction D1 in the lattice area of the black matrix BM overlaps the gate wirings GL (2n−1) and GL (2n). Further, the linear section extending in the direction D2 in the lattice area of the black matrix BM overlaps the short rings SR1 to SR3 or the common wiring 18. The line width of the linear section extending in the direction D1 in the lattice area of the black matrix BM is larger than the line widths of the gate wirings GL (2n−1) and GL (2n). In addition, the line width of the linear section extending in the direction D2 in the lattice area of the black matrix BM is larger than a line width of the short ring SG or a line width of the common wiring 18.

Similar to FIG. 12, the planar layout shown in FIG. 15 also has an area in which one wiring is formed in a stacked structure of the first conductive layer 202 and the second conductive layer 206. The first conductive layer 202 is stacked with the second conductive layer 206, and the first conductive layers 202 and the second conductive layer 206 are connected to each other. For example, the second conductive layer 206 may be spaced apart in the gate wiring GL (2n−1). Thus, even if static electricity is generated in the manufacturing process of the display area 12 and the peripheral area 14 in the array substrate 150, the static electricity can be released, and thus the occurrence of defects caused by the static electricity can be suppressed.

Figure 16:
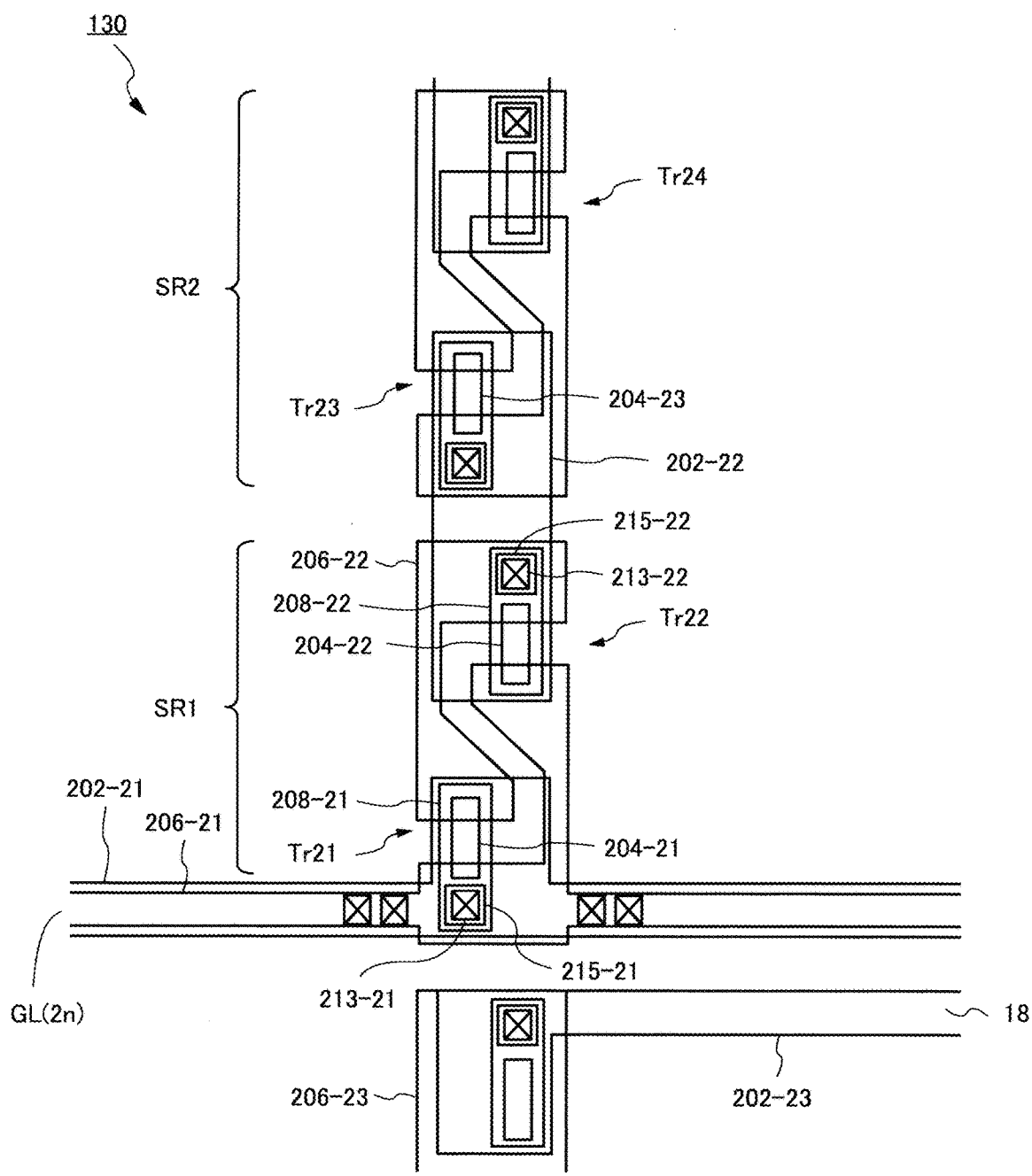
FIG. 16 is an enlarged view of an area in the short ring shown in FIG. 15.
Figure 17:
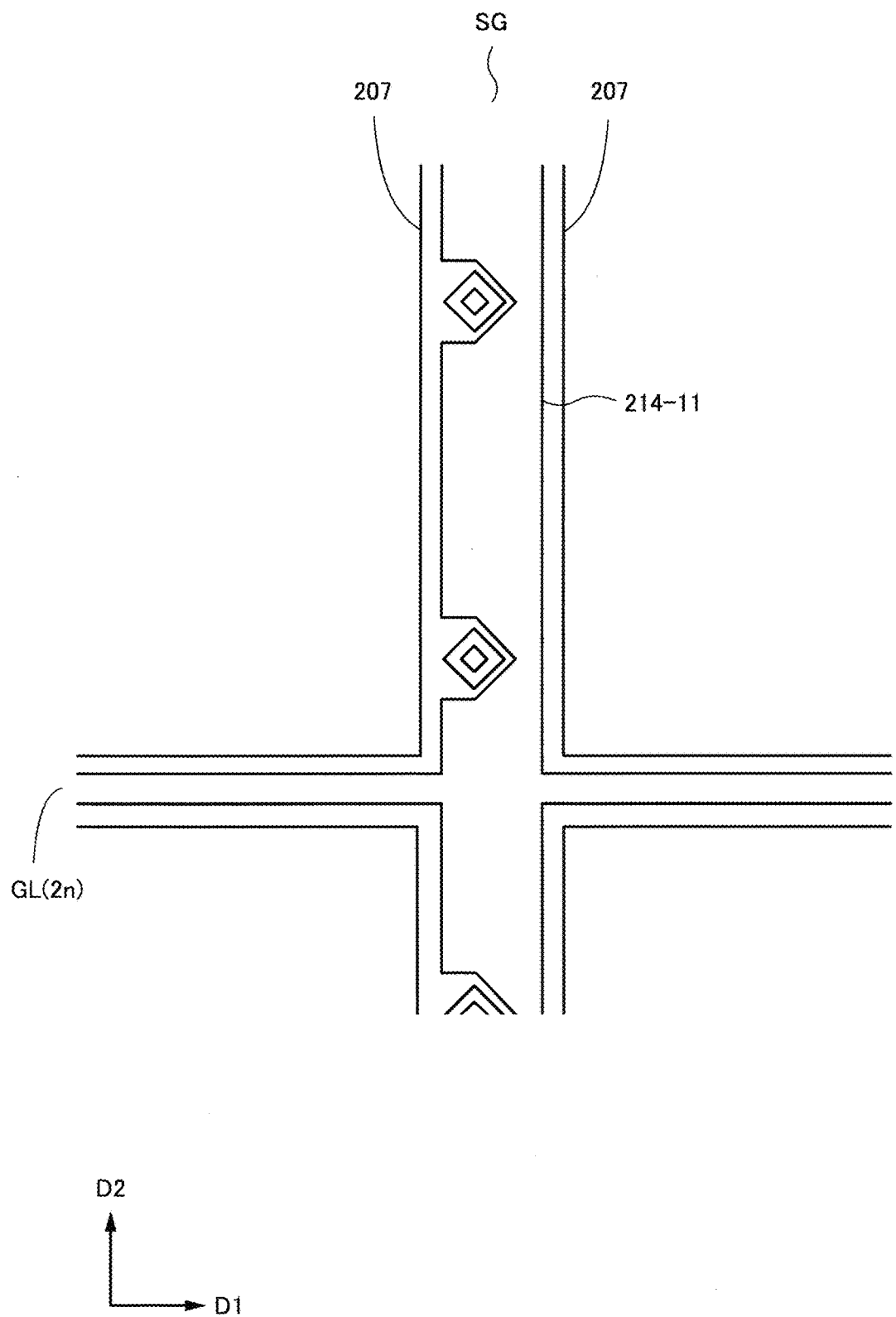
FIG. 17 is a plan view of an area including the short ring.

FIG. 16 and FIG. 17 are enlarged views of an area 130 including the transistors Tr21 to Tr24 in the short ring SG shown in FIG. 14. FIG. 16 shows a first conductive layer, an oxide semiconductor layer, a second conductive layer, and a third conductive layer. In addition, FIG. 17 shows the planarization film 207 and the fourth conductive layer 214. Further, since the transparent conductive layer 212 is arranged on the entire surface of the array substrate 150, illustration thereof is omitted in FIG. 15.

First conductive layers 202-21 and 202-22 are arranged on the array substrate 150. As shown in FIG. 16, the first conductive layer 202-21 has an area extending in the direction D1 and an area bent in the direction D2. The area extending in the direction D1 of the first conductive layer 202-21 functions as the gate wiring GL (2n). In addition, the area bent in the direction D2 of the first conductive layer 202-21 functions as a gate electrode of the transistor Tr21. The first conductive layer 202-22 extends in the direction D2 while being spaced apart from the area bent in the direction D2 of the first conductive layer 202-21.

An oxide semiconductor layer 204-21 is arranged on the area bent in the direction D2 of the first conductive layer 202-21. Oxide semiconductor layers 204-22 and 204-23 are arranged on the first conductive layer 202-22. The second conductive layers 206-21 and 206-22 are arranged on the oxide semiconductor layers 204-21 and 204-22.

The second conductive layer 206-21 has an area extending in the direction D1 and an area bent in the direction D2.

The area extending in the direction D1 of the second conductive layer 206-21 is connected to the oxide semiconductor layer 204-21, and the area bent in the direction D2 is connected to the oxide semiconductor layer 204-22. The second conductive layer 206-22 is connected to the oxide semiconductor layers 204-21 and 204-22. Further, the second conductive layer 206-21 is connected to the first conductive layer 202-21 via an opening 213-21 arranged in the gate insulating film 203. The second conductive layer 206-22 is connected to the first conductive layer 202-22 via an opening 213-22 arranged in the gate insulating film 203.

A third conductive layer 208-21 is arranged on the oxide semiconductor layer 204-21 and the second conductive layers 206-21 and 206-22. The third conductive layer 208-21 is connected to the second conductive layer 206-21 via an opening 215-21 arranged in the insulating film 205. A third conductive layer 208-22 is arranged on the oxide semiconductor layer 204-22 and the second conductive layers 206-21 and 206-22. The third conductive layer 208-22 is connected to the second conductive layer 206-22 via an opening 215-22 arranged in the insulating film 205.

The gate of the transistor Tr21 and the gate of the transistor Tr22 can be connected by the first conductive layer 202-22. Since configurations of the short rings SR2 and SR3 are the same as that of the short ring SR1, detailed explanation thereof will be omitted.

Referring to FIG. 8 and FIG. 17, the planarization film 207 is arranged in a lattice. The planarization film 207 is arranged so as to cover the gate wirings GL (2n−1) and GL (2n) and the short rings SR1 to SR3. That is, the planarization film 207 is not arranged in an area other than the gate wirings GL (2n−1) and GL (2n) and the short rings SR1 to SR3. Referring to FIG. 8 and FIG. 17, the transparent conductive layer 212 is arranged on the entire surface of the planarization film 207. Referring to FIG. 8 and FIG. 17, the fourth conductive layer 214-11 is arranged in a lattice. The fourth conductive layer 214-11 is arranged on the gate wirings GL (2n−1) and GL (2n) and the short rings SR1 to SR3.

With the planar layout shown in FIG. 16 and FIG. 17, the short ring SR1 can be constituted by the sources and the drains of the transistors Tr21 and Tr22 being connected to each other and one of the sources and the drains of the transistors Tr21 and Tr22 being connected to the gate of the transistor Tr21. In addition, the short rings SR1 to SR3 can be arranged in series along the direction D2. Therefore, the short rings SR1 to SR3 can be hidden by the linear section of the black matrix BM.

As described above, in the display device 10 according to the embodiment of the present invention, the black matrix BM is arranged so as to cover the plurality of wirings arranged in the direction D1 and the direction D2 and the transistors formed in close proximity in the peripheral area 14 (non-display area). Therefore, the reflection of light by the plurality of wirings or the like arranged in the peripheral area 14 can be suppressed. In addition, a color can be prevented from being changed due to a difference in materials when viewed from the opposing substrate side in the display area 12 and the peripheral area 14. Therefore, the boundary between the display area 12 and the peripheral area 14 can be made seamless in the display device 10.

Further, the transparency can be increased in the peripheral area 14 as in the display area 12 by making the wiring density in the display area 12 and a wiring density in the peripheral area 14 substantially the same. In addition, the transparency of the peripheral area 14 can be increased to the same level as that of the display area 12 by arranging peripheral circuits such as the gate inspection circuit 48 and the short ring SG so as to overlap the lattice black matrix BM.

[Material of Each Member of Display Device 10]

A rigid substrate having translucency and not flexibility such as a glass substrate, a quartz substrate, and a sapphire substrate can be used as the array substrate 150 and the opposing substrate 152. On the other hand, a flexible substrate including a resin and having flexibility such as a polyimide substrate, an acrylic substrate, a siloxane substrate, or a fluororesin substrate can be used as the array substrate 150 and the opposing substrate 152 in the case where the array substrate 150 and the opposing substrate 152 need to have flexibility. Impurities may be introduced into the resin described above in order to improve the heat resistance of the array substrate 150 and the opposing substrate 152. A glass substrate is preferably used as the array substrate 150 and the opposing substrate 152 in the case where the display device 10 is applied to a transparent display or a large high-definition display. The first transparent substrate 151A and the second transparent substrate 151B are arranged to protect the array substrate 150 and the opposing substrate 152. For this reason, for example, a glass substrate, a plastic substrate, or the like having a translucent property is preferably used.

A general metal material can be used as the first conductive layer 202, the second conductive layer 206, the third conductive layer 208, and the fourth conductive layer 214. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), and alloys or compounds thereof are used as these members. The material described above may be used in a single layer or in a stacked layer as the member described above. For example, stacked layers of Al\Ti are used as the first conductive layers 202. For example, stacked layers of TiN\Ti\Al\Ti\TiN are used as the second conductive layer 206. For example, Mo is used as the third conductive layer 208. A laminated structure of Mo\Al is used as the fourth conductive layer.

A general insulating material can be used as the gate insulating film 203, the insulating film 205, and the insulating film 209. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) can be used as the gate insulating film 203, the insulating film 205, and the insulating film 209. An insulating layer with few defects can be used as these insulating layers. Organic insulating materials such as polyimide resin, acrylic resin, epoxy resin, silicone resin, fluororesin, or siloxane resin can be used as the planarization film 207. The organic insulating materials described above may be used as the gate insulating film 203, the insulating film 205, and the insulating film 209. The materials described above may be used in a single layer or in stacked layers as the member described above. For example, a stacked structure of silicon nitride and silicon oxide is used as the gate insulating film 203. For example, a stacked structure of silicon oxide and silicon nitride is used as the insulating film 205. Further, silicon nitride is used as the insulating film 209.

$SiO_xN_y$ and $AlO_xN_y$ described above are silicon-containing and aluminum-containing compounds that contain a smaller proportion of nitrogen (N) than oxygen (O) (x>y). In addition, $SiN_xO_y$ and $AlN_xO_y$ are silicon compounds and aluminum compounds that contain a smaller proportion of oxygen than nitrogen (x>y).

A metal oxide having characteristics of a semiconductor can be used as the oxide semiconductor layer 204. The oxide semiconductor layer 204 has translucent properties. For example, oxide semiconductors including indium (In), gallium (Ga), zinc (Zn), and oxygen (O) can be used. In particular, oxide semiconductors having a composition ratio of In:Ga:Zn:O=1:1:1:4 can be used. However, the oxide semiconductor containing In, Ga, Zn, and O used in the present embodiment is not limited to the above composition, and an oxide semiconductor having a composition other than the above may be used. For example, the proportion of In may be larger in order to improve mobility. In addition, the proportion of Ga may be larger in order to increase the bandgap and reduce the effect of light irradiation.

In the present embodiment, although an example in which an oxide semiconductor layer is used as the semiconductor layer has been described, a semiconductor layer using amorphous silicon or polysilicon may be used.

A mixture of indium oxide and tin oxide (ITO) and a mixture of indium oxide and zinc oxide (IZO) can be used as the transparent conductive layer 212, the pixel electrode 216, and the common electrode 218. Materials other than the above may be used as the transparent conductive layer.

The black matrix BM (light-shielding layer 219) may be formed of a black resin or a metallic material. The black matrix BM is formed in contact with the common electrode 218 (see FIG. 7). A function as an auxiliary electrode for reducing resistive loss can be provided by forming the black matrix BM of a metallic material with respect to the common electrode 218 formed of the transparent conductive film. The black matrix BM is preferably made of a material having a relatively low reflectance with respect to aluminum such as chromium, molybdenum, and titanium.

A polymer-dispersed liquid crystal is preferably used as the liquid crystal layer 211 in the case where the display device 10 is applied to a transparent display. The polymer-dispersed liquid crystal includes bulk and fine particles. An orientation of the fine particles changes in accordance with the potential difference between the pixel electrode 216 and the common electrode 218 in the bulk. A degree of at least one of the translucency or dispersion of light is controlled for each pixel PIX by individually controlling the potential of the pixel electrode 216 for each pixel PIX. A scattering degree of the liquid crystal layer (fine particles) is controlled in accordance with the voltage of each pixel electrode 216 and the voltage of the common electrode 218. For example, the liquid crystal layer may be a polymer-dispersed liquid crystal in which a degree of scattering increases as the voltage between each pixel PIX and the common electrode 218 increases, or a polymer-dispersed liquid crystal in which a degree of scattering increases as the voltage between each pixel electrode 216 and the voltage between the common electrode 218 decreases.

The ordinary refractive indices of the bulk and fine particles are equal to each other in the liquid crystal layer 211. In the state where no voltage is applied between the pixel electrode 216 and the common electrode 218, the refractive index difference between the bulk and the fine particles is zero in all directions. The liquid crystal layer 211 becomes a non-scattering state in which the light emitted from the light source is not scattered. The light emitted from the light source propagates in a direction away from a light source 104 (light-emitting part) while being reflected at a first main surface of the array substrate 150 and a first main surface of the opposing substrate 152. In the case where the liquid crystal layer 211 is in the non-scattering state in which the light L emitted from the light source is not scattered, a background of the opposing substrate 152 can be visually recognized from the array substrate 150 and a background of the array substrate 150 can be visually recognized from the opposing substrate 152.

Between the pixel electrode 216 and the common electrode 218 to which the voltage is applied, an optical axis of the fine particles will be tilted due to an electric field generated between the pixel electrode 216 and the common electrode 218. Since an optical axis of the bulk does not change due to the electric field, directions of the optical axis of the bulk and the optical axis of the fine particles are different from each other. In the pixel PIX having the pixel electrode 216 to which the voltage is applied, the light emitted from the light source is scattered. Light which part of the scattered light emitted from the light source as described above is emitted to the outside from the first main surface of the array substrate 150 or the first main surface of the opposing substrate 152 is observed by the observer.

In the pixel PIX having the pixel electrode 216 to which the voltage is not applied, the background on the first main surface side of the opposing substrate 152 can be visually recognized from the first main surface of the array substrate 150 and the background on the first main surface side of the array substrate 150 can be visually recognized from the first main surface of the opposing substrate 152. Further, in the case where the video signal is input to the display device 10 of the present embodiment, a voltage is applied to the pixel electrode 216 of the pixel PIX on which an image is displayed, and an image based on the video signal is visually recognized together with the background. As described above, an image is displayed in the display area when the polymer-dispersed liquid crystal is in the scattering state.

In the present embodiment, although the planar layout of the black matrix BM, the gate inspection circuit, the short ring, the common wiring, and the like are laid out, an embodiment of the present invention is not limited thereto. The lattice black matrix BM can have the same configuration as that of the gate inspection circuit for a planar layout of the source inspection circuit. For example, the first lattice area of the black matrix BM may be arranged so as to overlap the source wiring and the signal line constituting the source inspection circuit. Further, a planarization film having a lattice area overlapping the first lattice area and overlapping the source wiring and the signal line constituting the source inspection circuit may be arranged.

While preferred embodiments have been described above, the present invention is not limited to such embodiments. The contents disclosed in the embodiments are merely examples, and various changes can be made without departing from the spirit of the present invention. Appropriate changes that have been made without departing from the spirit of the present invention naturally fall within the technical scope of the present invention.

What is claimed is:

1. A display device comprising:
a first substrate including a first gate wiring extending in a first direction, a second gate wiring arranged next to the first gate wiring in a second direction intersecting the first direction, a first wiring extending in the second direction, a second wiring arranged next to the first wiring in the first direction, and a peripheral circuit arranged in a peripheral area outside of a display area; and
a second substrate including a black matrix,
wherein
each of the first wiring and the second wiring is arranged in the peripheral area,
each of the first wiring and the second wiring crosses the first gate wiring and the second gate wiring,
the black matrix has a first portion extending parallel to the first gate wiring and overlapping with the first gate wiring, a second portion extending parallel to the second gate wiring and overlapping with the second gate wiring, a third portion extending parallel to the first wiring and overlapping with the first wiring, a fourth portion extending parallel to the second wiring and overlapping with the second wiring, and an opening surrounded by the first portion, the second portion, the third portion and the fourth portion, in the peripheral area,
the peripheral circuit includes a transistor,
a semiconductor layer of the transistor overlaps the third portion and is arranged inside of the third portion.

2. The display device according to claim 1, wherein
a gate electrode of the transistor is electrically connected to the second wiring,
a source electrode of the transistor is electrically connected to the first wiring, and
a drain electrode of the transistor is electrically connected to the second gate wiring.

3. The display device according to claim 2, wherein the peripheral circuit is a gate inspection circuit.

4. The display device according to claim 2, wherein
a portion of the gate electrode of the transistor is pulled out from the second wiring to the semiconductor layer of the transistor along the second gate wiring,
the portion of the gate electrode of the transistor overlaps the second portion of the black matrix.

5. The display device according to claim 2, wherein
a background of the second substrate is visible from the first substrate by the opening of the black matrix in the peripheral area, and
a background of the first substrate is visible from the second substrate by the opening of the black matrix in the peripheral area.

6. A display device comprising:
a first substrate including a first gate wiring extending in a first direction, a second gate wiring arranged next to the first gate wiring in a second direction intersecting the first direction, a common wiring extending in the second direction, a peripheral circuit arranged in a peripheral area outside of a display area; and
a second substrate including a black matrix, wherein
the common wiring is arranged in the peripheral area,
the common wiring crosses the first gate wiring and the second gate wiring,
the peripheral circuit includes a plurality of transistors arranged in the second direction between the first gate wiring and the second gate wiring,
the black matrix has a first portion extending parallel to the first gate wiring and overlapping with the first gate wiring, a second portion extending parallel to the second gate wiring and overlapping with the second gate wiring, a third portion extending parallel to the common wiring and overlapping with the common wiring, a fourth portion extending in the second direction and overlapping with the plurality of transistors of the peripheral circuit, and an opening surrounded by the first portion, the second portion, the third portion and the fourth portion, in the peripheral area, each of the plurality of transistors of the peripheral circuit is arranged inside of the fourth portion.

7. The display device according to claim 6, wherein the peripheral circuit is a short ring, one end of the short ring is electrically connected to the common wiring, and the other end of the short ring is electrically connected to the second gate wiring.

8. The display device according to claim 6, wherein the plurality of transistors of the peripheral circuit has at least a first transistor, a second transistor and a third transistor, the first to third transistors are arranged in the second direction, and each of the first to third transistors overlaps the fourth portion of the black matrix.

9. The display device according to claim 8, wherein a source electrode and a drain electrode of the first transistor are electrically connected to a source electrode and a drain electrode of the second transistor, one of the source and drain electrodes and a gate electrode of the first transistor are electrically connected to the second gate wiring, the other of the source and drain of electrodes the first transistor is electrically connected to a gate electrode of the second transistor and a gate electrode of the third transistor.

10. The display device according to claim 7, wherein a background of the second substrate is visible from the first substrate by the opening of the black matrix in the peripheral area, and a background of the first substrate is visible from the second substrate by the opening of the black matrix in the peripheral area.

\* \* \* \* \*